US 7,538,394 B2

(12) United States Patent
Asano

(10) Patent No.: US 7,538,394 B2
(45) Date of Patent: May 26, 2009

(54) COMPOUND SEMICONDUCTOR SWITCH CIRCUIT DEVICE

(75) Inventor: Tetsuro Asano, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 416 days.

(21) Appl. No.: 11/314,101

(22) Filed: Dec. 22, 2005

(65) Prior Publication Data

US 2006/0164150 A1    Jul. 27, 2006

(30) Foreign Application Priority Data

Dec. 22, 2004   (JP) ............................. 2004-371833

(51) Int. Cl.
   *H01L 23/62* (2006.01)
(52) U.S. Cl. .................. 257/355; 257/360; 257/275; 257/E29.029
(58) Field of Classification Search ................ 257/275, 257/355, 360, E29.029; 327/430, 431, 566; 438/430, 431, 566
See application file for complete search history.

(56) References Cited

U.S. PATENT DOCUMENTS

| | | | |
|---|---|---|---|
| 4,261,004 A | 4/1981 | Masuhara et al. |
| 4,339,285 A | 7/1982 | Pankove |
| 4,387,386 A | 6/1983 | Garver |
| 4,626,802 A | 12/1986 | Gailus |
| 4,745,445 A | 5/1988 | Mun et al. |
| 4,803,527 A | 2/1989 | Hatta et al. |
| 4,843,440 A | 6/1989 | Huang |
| 4,965,863 A | 10/1990 | Cray |
| 5,047,355 A | 9/1991 | Huber et al. |
| 5,157,573 A | 10/1992 | Lee et al. |
| 5,371,405 A | 12/1994 | Kagawa |
| 5,374,899 A | 12/1994 | Griffiths et al. |
| 5,559,363 A | 9/1996 | Immorlica, Jr. |
| 5,654,860 A | 8/1997 | Casper et al. |
| 5,684,323 A | 11/1997 | Tohyama |
| 5,821,827 A | 10/1998 | Mohwinkel et al. |
| 5,841,184 A | 11/1998 | Li |
| 5,932,917 A | 8/1999 | Miura et al. |
| 5,986,863 A | 11/1999 | Oh |
| 6,002,860 A | 12/1999 | Voinigescu et al. |

(Continued)

FOREIGN PATENT DOCUMENTS

CN    1492585    4/2004

(Continued)

OTHER PUBLICATIONS

Miyawaki, Yasuo et al. (1986) "Ion-Implanted Low Noise Dual GaAs MESFET," Sanyo Technical Review 18(2), pp. 76-84.

(Continued)

*Primary Examiner*—Eugene Lee
(74) *Attorney, Agent, or Firm*—Morrison & Foerster LLP

(57) ABSTRACT

High-resistance elements are connected as parts of a control resistor between a switching element and a protecting element immediately near the switching element and between adjacent protecting elements. Paths for high-frequency signals are cut off, and high-frequency signals can be prevented from leaking although there are parasitic capacitances due to the protecting elements being connected. Accordingly, electrostatic breakdown voltage can be improved, and isolation can be prevented from deteriorating.

11 Claims, 15 Drawing Sheets

U.S. PATENT DOCUMENTS

| | | | |
|---|---|---|---|
| 6,265,756 B1 | 7/2001 | Brocket et al. | |
| 6,580,107 B2 | 6/2003 | Higashino et al. | |
| 6,914,280 B2 | 7/2005 | Asano et al. | |
| 6,946,891 B2 | 9/2005 | Asano et al. | |
| 7,193,255 B2 | 3/2007 | Asano | |
| 2002/0024375 A1 | 2/2002 | Asano et al. | |
| 2002/0047177 A1 | 4/2002 | Asano et al. | |
| 2004/0077150 A1 | 4/2004 | Tosaka | |
| 2004/0130380 A1 | 7/2004 | Asano et al. | |
| 2004/0222469 A1* | 11/2004 | Asano et al. | 257/355 |
| 2004/0223274 A1 | 11/2004 | Asano et al. | |
| 2005/0121730 A1 | 6/2005 | Asano et al. | |
| 2005/0263796 A1 | 12/2005 | Asano | |
| 2005/0274979 A1 | 12/2005 | Asano | |
| 2005/0277255 A1 | 12/2005 | Asano | |
| 2005/0285143 A1 | 12/2005 | Asano | |
| 2006/0151816 A1 | 7/2006 | Asano et al. | |
| 2006/0163609 A1 | 7/2006 | Asano et al. | |
| 2006/0163659 A1 | 7/2006 | Asano et al. | |
| 2006/0164150 A1 | 7/2006 | Asano | |
| 2006/0252651 A1 | 11/2006 | Asano et al. | |
| 2006/0255403 A1 | 11/2006 | Asano et al. | |
| 2006/0289963 A1 | 12/2006 | Asano et al. | |

FOREIGN PATENT DOCUMENTS

| | | |
|---|---|---|
| DE | 3334167 | 4/1985 |
| EP | 0140095 | 5/1985 |
| EP | 0700161 | 3/1996 |
| JP | 60-86874 | 5/1985 |
| JP | 62-174975 | 7/1987 |
| JP | 2-162744 | 6/1990 |
| JP | 8-236549 | 9/1996 |
| JP | 2723936 | 11/1997 |
| JP | 11-220093 | 8/1999 |
| JP | 2002-368194 | 12/2002 |
| JP | 2004-103786 | 4/2004 |
| KR | 1998-043416 | 9/1998 |
| KR | 1998-065222 | 10/1998 |
| WO | WO-96/22613 | 7/1996 |
| WO | WO-97/45877 | 4/1997 |

OTHER PUBLICATIONS

S.M.Sze Physics of Semiconductor Devices. New York: John Wiley & Sons, 1981, vol. 2, pp. 117-122.

Anderson, W.R. et al. "ESD Protection under Wire Bonding Pads," EOS/ESD Symposium, Jan. 1, 1999, pp. 88-94.

* cited by examiner

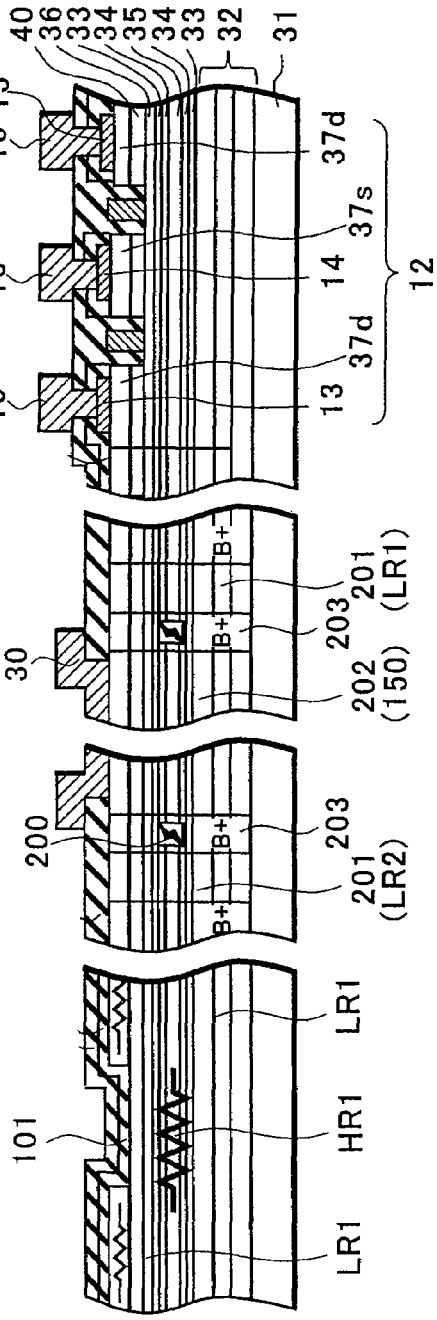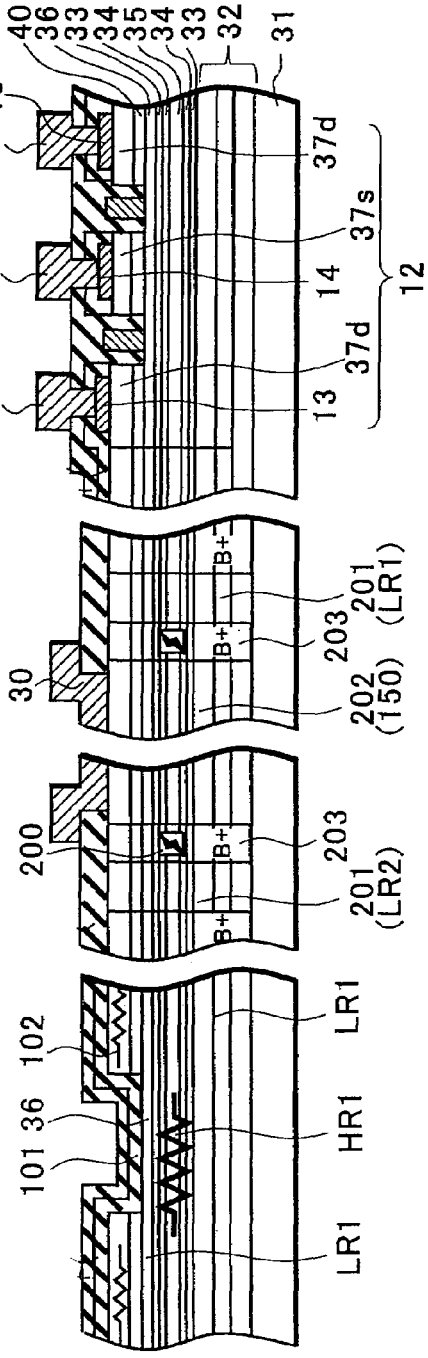

Prior Art

Prior Art

Prior Art

COMPOUND SEMICONDUCTOR SWITCH CIRCUIT DEVICE

BACKGROUND OF THE INVENTION

1. Field of the Invention

The present invention relates to a compound semiconductor switch circuit device. In particular, the present invention relates to a compound semiconductor switch circuit device in which isolation is improved.

2. Description of the Related Art

In mobile communication instruments such as cellular phones, microwaves in the GHz band are often used. In many cases, switch elements for switching among such high-frequency signals are used in antenna switch circuits and transmit-receive switch circuits. Since such switch elements deal with high frequencies, field-effect transistors (hereinafter referred to as "FETs") constructed using gallium arsenide (GaAs) are often used as the switch elements. Along with this, monolithic microwave integrated circuits (MMICs) are being developed into which the switch circuits themselves are integrated.

Further, as illustrated in FIG. 15, a technology is known in which protecting elements 200 having n+/i/n+ structures are connected between two terminals of an element to be protected, in order to greatly improve electrostatic breakdown voltage in a compound semiconductor device.

FIG. 15 illustrates a compound semiconductor switch circuit device called a singlepole doublethrow (SPDT) switch constructed using GaAs FETs.

The sources (or drains) of FET1 as a first FET and FET2 as a second FET are connected to a common input terminal IN. The gates of FET1 and FET2 are connected to first and second control terminals Ctl1 and Ctl2 through control resistors R1 and R2, respectively. The drains (or sources) of the FETs are connected to first and second output terminals OUT1 and OUT2, respectively. Control signals applied to the first and second control terminals Ctl1 and Ctl2 are complementary signals. Of the FETs, one to which an H-level signal is applied is turned on, whereby a high-frequency analog signal inputted to the common input terminal IN is transmitted to either of the output terminals.

Pads I, O1, O2, C1, and C2 which respectively serve as the common input terminal IN, the first and second output terminals OUT1 and OUT2, and the first and second control terminals Ctl1 and Ctl2 are provided around FET1 and FET2 in a peripheral portion of a substrate.

Source and drain electrodes 315 and 316 of FET1 are placed in a state in which comb-teeth-like portions are engaged. The gate electrode 317 thereof is placed between the source and drain electrodes 315 and 316.

A peripheral impurity region 350 for improving isolation is provided around each pad 330. Further, the control resistors R1 and R2, which are impurity regions, are placed near the common input terminal pad I and the first and second output terminal pads O1 and O2. Thus, protecting elements 200 having n+/i/n+ structures are connected between the input terminal IN and the first control terminal Ctl1 (or second control terminal Ctl2) and between the first output terminal OUT1 (or second output OUT2) and the first control terminal Ctl1 (or second control terminal Ctl2), and static electricity is discharged. This technology is described for instance in Japanese Patent Application Publication No. 2004-103786.

FIG. 16 illustrates a circuit diagram of FIG. 15, and FIGS. 17A to 17C illustrate schematic diagrams of the switch MMIC of FIG. 15 in operation.

As illustrated in FIG. 15, the control resistors R1 and R2, which respectively connect the first and second control terminal pads C1 and C2 with FET1 and FET2, are extended in a chip and placed near the input terminal pad I and the first and second output terminal pads O1 and O2.

It is effective that electrostatic energy applied between the common input terminal IN and the first control terminal Ctl1 (or second control terminal Ctl2) is discharged immediately near the pads which serve as these terminals. Accordingly, protecting elements 200 are preferably connected in the vicinities of the pads.

The peripheral impurity regions 350 for improving isolation are respectively placed around the pads. Further, the first and second control terminal pads C1 and C2 are respectively connected to the gate electrodes of FET1 and FET2 using connecting paths, which are impurity ion-implanted regions. Each of these connecting paths is an impurity region and is the resistor (control resistor) R1 (or R2) having a predetermined resistance value. The connecting paths prevent high-frequency signals from leaking from the gate electrodes to the control terminals which are at GND potential for high frequencies.

Accordingly, the control resistor R1 (or R2) is placed along and near the common input terminal pad I to be spaced therefrom by a distance of 4 μm. The control resistor R1 (or R2) includes a resistor R11 (or R21) of 2 kΩ and a resistor R12 (or R22) of 4 kΩ and the like. Thus, a protecting element 200b including the control resistor R1 (or R2), the peripheral impurity region 350, and an insulating region (GaAs substrate) therebetween is connected between the common input terminal IN and the first control terminal Ctl1 (or second control terminal Ctl2). Accordingly, the above-described pattern can greatly improve electrostatic breakdown voltage.

Further, the control resistor R1 (or R2) is placed along and near the first output terminal pad O1 (or the second output terminal pad O2) to be spaced therefrom by a distance of 4 μm.

Thus, a protecting element 200a including the control resistor R1 (or R2), the peripheral impurity region 350, and an insulating region (GaAs substrate) therebetween is connected between the first output terminal OUT1 (or second output terminal OUT2) and, the first control terminal Ctl1 (or second control terminal Ctl2). Accordingly, the above-described pattern can greatly improve the minimum value of electrostatic breakdown voltage.

However, in the case where the control resistor R1 (or R2) is placed near the common input terminal pad I and the first output terminal pad O1 (or second output terminal pad O2), there arises the problem that isolation is deteriorated.

FIGS. 17A to 17C are diagrams each illustrating an overview of a switch MMIC in operation. The switch MMIC is similar to that of FIG. 15. However, FIGS. 17A and 17B are diagrams for the case where the protecting elements 200 are not connected, i.e., the case where the control resistor R1 is placed without being close to each pad; and FIG. 17C is a diagram for the case where the protecting elements 200 are connected as in FIG. 15. It should be noted that FET1 and FET2 are symmetrically placed and have similar structures. Accordingly, the FET1 side will be described below.

FIG. 17A is a schematic cross-sectional view of FET1 when an electrical path between the common input terminal IN and the first output terminal OUT1 is off, i.e., when the FET1 side is off. Further, FIG. 17A corresponds to a cross-sectional view taken along line p-p of FIG. 15. However, FIG. 17A is a schematic diagram for explaining the state of operation, and therefore does not completely coincide with the structure of the FET of FIG. 15.

In the substrate surface in the region of the FET illustrated in FIG. 15, a channel layer 312 is provided which is an impurity-implanted region. On the surface of the channel layer 312, for example, a source electrode 315 which is on the common input terminal IN side and a drain electrode 316 which is on the first output terminal OUT1 side are placed, and a gate electrode 317 is provided therebetween to form a Schottky junction with part of the channel layer 312.

Further, when FET1 is off, a depletion layer 500 spreads in the channel layer 312 under the gate electrode 317 as illustrated in FIG. 17A and reaches a bottom portion of the channel layer 312 to pinch off the channel. Thus, the channel layer 312 is cut off. That is, in the case where the protecting elements 200 are not connected, FET1 is the only path through which a high-frequency analog signal inputted from the source electrode 315 on the common input terminal IN side is transmitted to the drain electrode 316 on the first output terminal OUT1 side.

In the switch MMIC, signals need to be prevented from leaking between the terminals of an FET (FET1 here) in an off state. To do so, it is desirable that the channel layer 312 is sufficiently cut off with the depletion layer 500 as illustrated in FIG. 17A to improve isolation.

FIG. 17B is an equivalent circuit diagram of FIG. 17A. The depletion layer 500 becomes a capacitive component, and FET1 in off state is in a state in which a capacitance between the gate terminal G and the source terminal S and that between the gate terminal G and the drain terminal D are connected in series. Further, the value of isolation is determined by the combined capacitance of the two capacitances.

FIG. 17C is a conceptual diagram of the control resistor R1 in the chip pattern diagram of FIG. 15.

In the chip pattern diagram of FIG. 15, the protecting elements 200b and 200a are formed by the control resistor R1 passing near the common input terminal pad I and the first output terminal pad O1, respectively.

Further, the resistor R11 of 2 kΩ is connected between the protecting element 200a and the gate terminal G of FET1, and the resistor R12 of 4 kΩ is connected between the protecting elements 200a and 200b. That is, each of these has a low resistance value of not more than 5 kΩ.

Thus, a path p1 for a high-frequency signal occurs between the drain terminal D and the gate terminal G of FET1 by the resistor R11 of 2 kΩ between the protecting element 200a on the first output terminal pad O1 side and the gate terminal G (gate electrode 317) and the parasitic capacitance of the protecting element 200a. Since a high-frequency signal leaks along this path p1, there is the problem that isolation is deteriorated.

Moreover, the resistance value of R12 between the protecting element 200a on the first output terminal pad O1 side and the protecting element 200b on the common input terminal pad I side is also 4 kΩ, which is not more than 5 kΩ. Accordingly, a path p2 for a high-frequency signal occurs between the drain terminal D and the source terminal S of FET1 (between the first output terminal pad O1 and the common input terminal pad I) by the resistor R12 of 4 kΩ and the parasitic capacitances of the protecting elements 200a and 200b. Since a high-frequency signal leaks along this path p2, there is the problem that isolation is further deteriorated.

SUMMARY OF THE INVENTION

BRIEF DESCRIPTION OF THE DRAWINGS

FIGS. 8A to 8C are cross-sectional views for explaining a third embodiment of the present invention.

FIGS. 9A to 9C are cross-sectional views for explaining a fourth embodiment of the present invention.

DESCRIPTION OF THE PREFERRED EMBODIMENTS

Embodiments of the present invention will be described in detail with reference to FIGS. 1 to 14B.

First, referring to FIGS. 1 to 5, a first embodiment of the present invention will be described using an SPDT switch circuit device including two switching elements.

Figure 1:
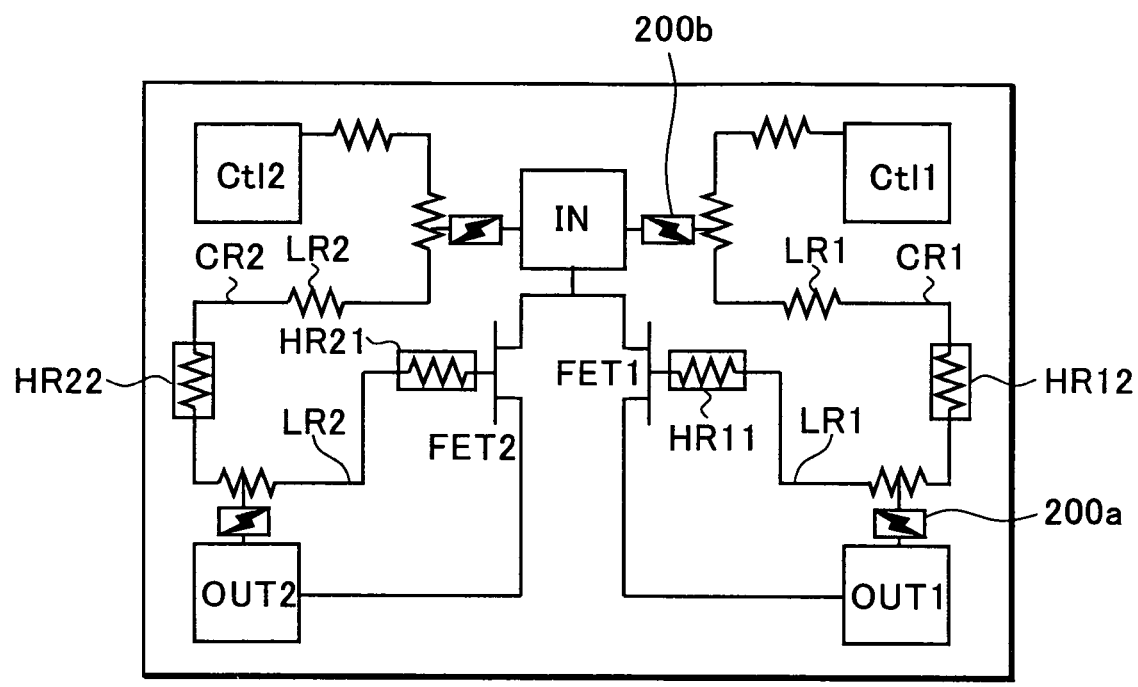
FIG. 1 is a circuit diagram for explaining a first embodiment of the present invention.

FIG. 1 is a circuit diagram illustrating a compound semiconductor switch circuit device. Source electrodes (or drain electrodes) of FETs (FET1 and FET2), which are two switching elements, are connected to a common input terminal IN. Gate electrodes of FET1 and FET2 are connected to a first control terminal Ctl1 and a second control terminal Ctl2 through a first connecting path and a second connecting path, respectively.

Further, the drain electrodes (or the source electrodes) of FET1 and FET2 are connected to a first output terminal OUT1 and a second output terminal OUT2, respectively. Control signals applied to the first and second control terminals Ctl1 and Ctl2 are complementary signals. Of the FETs, one to which an H-level signal is applied is turned on, whereby a high-frequency analog signal inputted to the common input terminal IN is transmitted to either of the output terminals. The first and second connecting paths are a first control resistor CR1 and a second control resistor CR2 formed by impurity regions, respectively. The first and second control resistors CR1 and CR2 are placed in order to prevent high-frequency signals from leaking through the gate electrodes to the DC potentials of the control terminals Ctl1 and Ctl2, which are AC grounded.

It should be noted that in an FET the source and drain electrodes are equivalent to each other and that the following description will be given using either of them. However, the following description also applies to the case where they are replaced with each other.

Figure 2A:
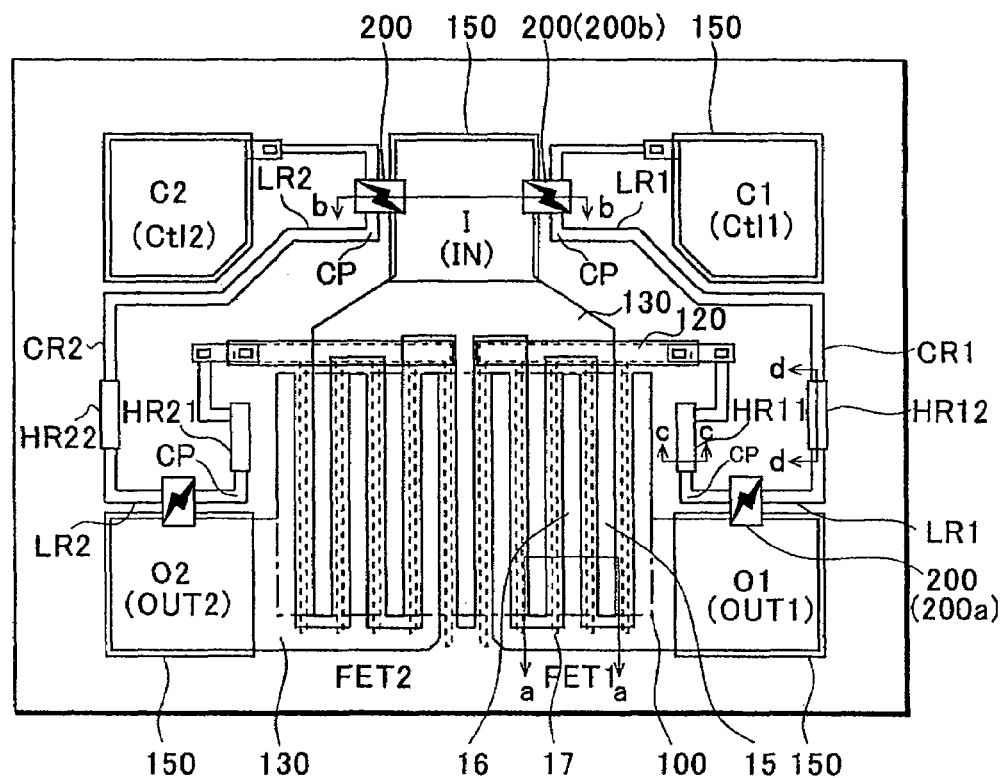
FIGS. 2A and 2B are a plan view and a cross-sectional view for explaining the first embodiment of the present invention, respectively.
Figure 2B:
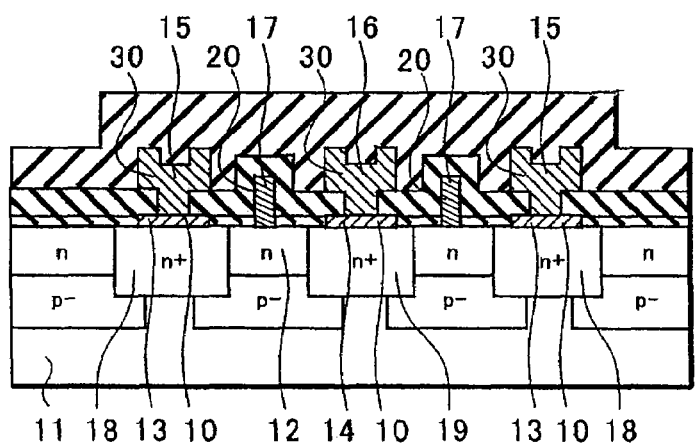

FIGS. 2A and 2B illustrate one example of a compound semiconductor chip into which the compound semiconductor switch circuit device illustrated in FIG. 1 is integrated. FIG. 2A is a plan view, and FIG. 2B is a cross-sectional view taken along line a-a in an operating region.

As illustrated in FIG. 2A, the two FETs (FET1 and FET2), which performs switching, are placed in a GaAs substrate 11. Further, pads I, O1, O2, C1, and C2 which respectively are connected to the common input terminal IN, the first and second output terminals OUT1 and OUT2, and the first and second control terminals Ctl1 and Ctl2 are provided in a peripheral portion of the substrate 11.

A second metal layer indicated by dotted lines is a gate metal layer (e.g., Pt/Mo) 20 formed simultaneously with the formation of the gate electrodes of the FETs. A third metal layer indicated by full lines is a pad metal layer (Ti/Pt/Au) 30 which connects elements and forms the pads. A first metal layer is an ohmic metal layer (AuGe/Ni/Au) 10 which forms an ohmic contact to the substrate 11, and forms the source and drain electrodes of the FETs, and the like. However, the first metal layer is overlapped by the pad metal layer 30 and therefore is not illustrated in FIG. 2A.

FET1 is formed in an operating region 100 surrounded by dashed-dotted lines. It should be noted that the first control terminal pad C1, the first control resistor CR1, and the first output terminal pad O1 on the FET1 side are placed to be symmetric with the second control terminal pad C2, the second control resistor CR2, and the second output terminal pad O2 on the FET2 side with respect to a center line of the chip. Accordingly, although the FET1 side will be described below, the following description also applies to the FET2 side.

The operating region 100 is a rectangular region which is surrounded by dashed-dotted lines and in which ions of an n-type impurity are implanted into the GaAs substrate 11. In the operating region 100, a source region 18 and a drain region 19 are selectively formed (see FIG. 2B) which are formed by n-type impurity regions of high concentration.

In FET1, three comb-teeth-like portions of the pad metal layer 30 which are extended from the lower side constitute a second drain electrode 16 connected to the first output terminal pad O1. Under the second drain electrode 16, there is a first drain electrode 14 formed by the ohmic metal layer 10. Further, three comb-teeth-like portions of the pad metal layer 30 which are extended from the upper side constitute a second source electrode 15 connected to the common input terminal pad I. Under the second source electrode 15, there is a first source electrode 13 formed by the ohmic metal layer.

The second source and drain electrodes 15 and 16 are placed in a shape in which the comb-teeth-like portions are engaged. A gate electrode 17 formed by the gate metal layer 20 is placed therebetween in a shape having five comb-teeth-like portions to form a Schottky junction with part of the operating region 100. It should be noted that the comb-teeth-shaped source electrode 15 extended in a central portion from the upper side is common to FET1 and FET2. This contributes to the miniaturization of the chip.

Each comb-teeth-like portions of the gate electrode 17 of FET1 are bundled by a gate wiring 120 formed by the gate metal layer 20 outside the operating region 100, and are connected to the first control terminal pad C1 through the first control resistor CR1.

The source and drain electrodes of each FET have a two-layer electrode structure including the ohmic metal layer 10 and the pad metal layer 30. The second source and drain electrodes 15 and 16 of the second layer are formed by the pad metal layer 30. Each comb-teeth-like portions of the second source electrode 15 and the second drain electrode 16 are bundled by pad wirings 130 formed by the pad metal layer 30 outside the operating region 100.

In the GaAs substrate 11, an n-type channel layer 12 is provided, and n-type impurity regions of high concentration which form the source and drain regions 18 and 19 are provided on both sides of the n-type channel layer 12. The gate electrode 17 forms a Schottky junction with the channel layer 12. Moreover, the first source electrode 13 and the first drain electrode 14 formed by the ohmic metal layer 10 are provided in the source and drain regions 18 and 19. Further, the second source and drain electrodes 15 and 16 formed by the pad metal layer 30 are provided on the first source and drain electrodes 13 and 14 as described previously, and elements are wired (FIG. 2B).

In order to improve isolation, a peripheral impurity region 150, which is an impurity region of high concentration, is placed around each of the pads and the gate wiring 120. The peripheral impurity regions 150 are respectively connected to the pads in a state in which direct currents are allowed to flow (hereinafter referred to as "DC connected"). The peripheral impurity regions 150 are respectively provided in the entire areas under the pads (or provided around the pads) to be protruded from the pads. Alternatively, the peripheral impurity regions 150 may be provided around the pads to be spaced from the pads by distances of not more than 5 μm and may be DC connected to the pads through the semi-insulating substrate 11, respectively. Further, the peripheral impurity region 150 is also similarly DC connected to the gate wiring 120.

The first control resistor CR1 includes a low-resistance element LR1 which is a first conduction region. High-resistance elements HR11 and HR12 which are third conduction regions are connected in series with portions of the low-resistance element LR1. That is, the high-resistance elements HR11 and HR12 constitute part of the first control resistor CR1. Similarly, the second control resistor CR2 includes a low-resistance element LR2 which is the first conduction region. High-resistance elements HR21 and HR22 which are the third conduction regions are connected in series with portions of the low-resistance element LR2. That is, the high-resistance elements HR21 and HR22 constitute part of the second control resistor CR2. It should be noted that the high-resistance elements HR11, HR12, HR21, and HR22 will be described later.

Here, the low-resistance element LR1 is an ion-implanted region and is an impurity region of high concentration (peak concentration: 1 to $1.5 \times 10^{18}$ cm$^{-3}$) which is comparable to those of the source and drain regions 18 and 19 of the operating region 100. The low-resistance element LR1 has a low sheet resistance of approximately 100 Ω/sq. and a resistance value of approximately 3 to 5 kΩ. In the ion-implanted region, the impurity concentration varies with depth. Accordingly, the impurity concentration of an ion-implanted region is typified by the peak concentration. The low-resistance element LR2 has a similar structure. It should be noted that the low-resistance element LR1 (or LR2) may be discontinuous and that part of the first control resistor CR1 (or second control resistor CR2) may be a metal wiring.

Further, protecting elements 200 are connected in the vicinities of the common input terminal pad I and the first output terminal pad OUT1.

Figure 3A:
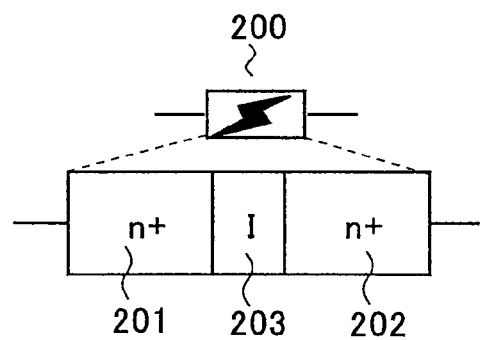
FIGS. 3A to 3C are a conceptual diagram, an equivalent circuit diagram, and a cross-sectional view for explaining the first embodiment of the present invention, respectively.
Figure 3B:
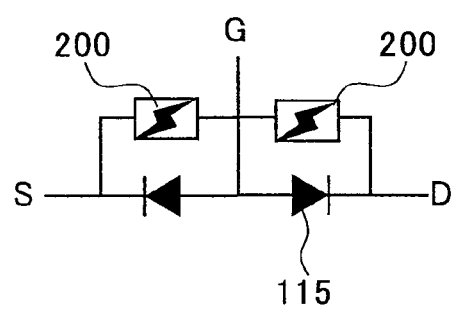
Figure 3C:
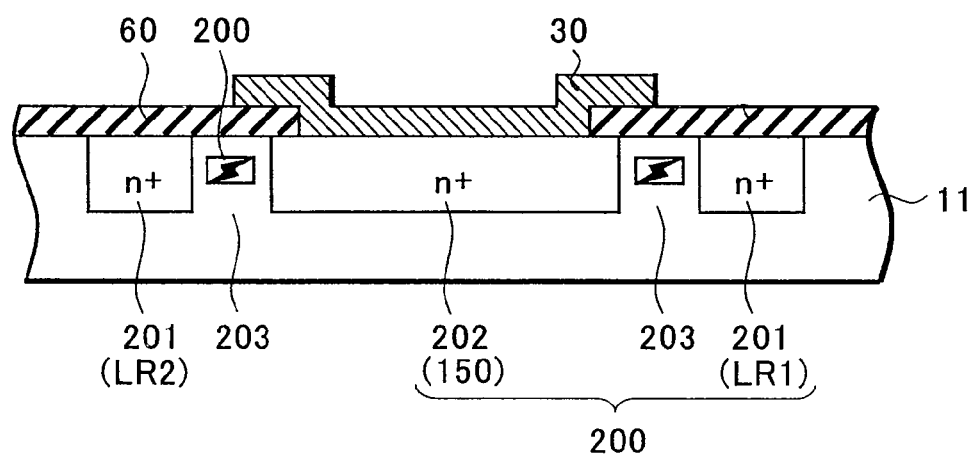

Here, the protecting elements 200 will be described. FIGS. 3A to 3C are diagrams illustrating the protecting elements 200. FIG. 3A is a conceptual diagram, FIG. 3B is a schematic circuit diagram, and FIG. 3C is a cross-sectional view taken along line b-b of FIG. 2A.

As illustrated in FIG. 3A, each protecting element 200 has a structure in which an insulating region 203 is placed between a first conduction region 201 and a second conduction region 202. The first and second conduction regions 201 and 202 are, for example, n-type impurity regions of high concentration.

The first conduction region (hereinafter referred to as a first n+ region) 201 and the second conduction region (hereinafter referred to as a second n+ region) 202 are provided to be spaced from each other by a distance over which electrostatic energy can be passed, e.g., a distance of approximately 4 μm. Both of the impurity concentrations thereof are not less than $1 \times 10^{17}$ cm$^{-3}$. Further, the insulating region 203 is placed between the first and second n+ regions 201 and 202 to be in contact therewith. Here, the insulating region 203 is not completely electrically insulator but is part of the semi-insulating substrate 11 or a region which is insulated by implanting ions of an impurity into the substrate 11. Further, it is desirable that the impurity concentration of the insulating region 203 is approximately not more than $1 \times 10^{14}$ cm$^{-3}$ and that the resistivity thereof is not less than $1 \times 10^{6}$ Ω·cm.

FIG. 3B is a diagram in which the portion of FET1 in FIG. 2A is replaced with an internal equivalent circuit. In each of the FETs constituting the switch MMIC, a gate Schottky junction is reverse biased when consideration is given to electrostatic breakdown voltage. That is, an equivalent circuit for this case is a circuit in which Schottky barrier diodes 115 are connected between a gate terminal G and a source terminal S and between the gate terminal G and a drain terminal D.

In each FET, a position at which electrostatic breakdown voltage is lowest is a Schottky junction portion (a gate Schottky junction) between the gate electrode and the operating region 100. That is, when electrostatic energy applied between the gate terminal G and the drain terminal D or between the gate terminal G and the source terminal S reaches the gate Schottky junction, if the electrostatic energy exceeds the electrostatic breakdown voltage between the gate and source terminals G and S or between the gate and drain terminals G and D, the gate Schottky junction is broken down.

Here, "between the common input terminal IN and the first control terminal Ctl1" corresponds to "between the source and gate terminals S and G of FET1", and "between the first output terminal OUT1 and the first control terminal Ctl1" corresponds to "between the drain and gate terminals D and G of FET1". It should be noted that the FET2 side is similar and therefore will not be described.

That is, before electrostatic energy applied between the common input terminal IN and the first control terminal Ctl1 reaches Schottky junction between the source and gate terminals S and G of FET1, the electrostatic energy must be attenuated in the reaching process. Further, before electrostatic energy applied between the first output terminal OUT1 and the first control terminal Ctl1 reaches Schottky junction between the drain and gate terminals D and G of FET1, the electrostatic energy must be attenuated in the reaching process.

Accordingly, the protecting elements 200 are connected therebetween. This makes it possible to discharge electrostatic energy applied to the Schottky barrier diodes 115 through the protecting elements 200 and to prevent an electrostatic breakdown.

FIG. 3C is a cross-sectional view taken along line b-b of FIG. 2A. It should be noted that although not described below, the second control resistor CR2 side is also similar.

The low-resistance element LR1 constituting the first control resistor CR1 is, for example, an n-type impurity region (n+ region) of high concentration similar to the source and drain regions 18 and 19 of the operating region 100. Further, the peripheral impurity regions 150, which are fourth conduction regions, are respectively placed around the pads and the wirings connected to the pads. The peripheral impurity regions 150 are n-type impurity regions (n+ regions) of high concentration which are provided as countermeasures for isolation in order to prevent high-frequency signals from leaking from the pads and the wirings.

The peripheral impurity regions 150 are respectively DC connected to the pads and provided in the entire areas under the pads (or around the areas under the pads) to be protruded from the pads. Alternatively, the peripheral impurity regions 150 may be respectively provided around the pads to be spaced from the pads by distances of not more than approximately 5 μm.

The pad metal layer 30 (each pad) forms a Schottky junction with the semi-insulating GaAs substrate 11 as illustrated in FIG. 3C. The peripheral impurity regions 150 and the corresponding pads also form Schottky junctions, respectively.

As illustrated in FIG. 3C, the low-resistance element LR1 is placed to be spaced from the peripheral impurity region 150 of the common input terminal pad I by a distance of 4 μm. Thus, the protecting element 200 having an n+/i/n+ structure is formed in which the low-resistance element LR1 serves as the first n+ region 201, the peripheral impurity region 150 adjacent thereto serves as the second n+ region 202, and the semi-insulating substrate 11 serves as the insulating region 203. That is, the protecting element 200 is connected between the common input terminal IN and the control terminal Ctl1, i.e., between the source and gate terminals, S and G of FET1 (or between the drain and gate terminals, G and D thereof).

Further, the protecting element 200 can be connected near the common input terminal pad I and in a path to the operating region 100 from the first control terminal pad C1 to which a signal is applied. This makes it possible to attenuate electrostatic energy applied to the switch circuit device before the electrostatic energy reaches the operating region 100.

Here, the longer the distance by which the protecting element 200 is placed along the pad, the more electrostatic energy can be attenuated. Accordingly, this distance is preferably not less than 10 μm.

Thus, the protecting element 200 is connected between the common input terminal pad I and the first control terminal pad C1 to be close to the common input terminal pad I, whereby electrostatic breakdown voltage can be greatly improved.

Further, it is preferable that the low-resistance element LR1 is placed near the first output terminal pad O1 and that another protecting element 200 is connected between the first control terminal Ctl1 and the first output terminal OUT1 (see FIG. 2A). Thus, the protecting elements 200 are connected both between the gate and drain terminals G and D of FET1 and between the gate and source terminals G and S thereof, and the minimum value of the electrostatic breakdown voltage of the switch circuit device can be improved.

Each protecting element 200 of this embodiment is an element which is connected by placing, for example, the peripheral impurity region 150 and the low-resistance element LR1 so that they are close to each other and which has a predetermined length. Further, an end portion of each protecting element 200 on the path of the first control resistor CR1, which end portion is closer to the switching element (FET1), is referred to as a connection point CP between the first control resistor CR1 and the protecting element 200. Further, this is the same in the second control resistor CR2.

Connecting the protecting elements 200 makes it possible to greatly improve the electrostatic breakdown voltage of the switch MMIC. On the other hand, the isolation between the common input terminal IN and the first control terminal Ctl1 (or second control terminal Ctl2) and that between the first output terminal OUT1 (or second output terminal OUT2) and the first control terminal Ctl1 (or second control terminal Ctl2) is deteriorated by the low-resistance elements LR1 and LR2 and the parasitic capacitances of the protecting elements 200.

Accordingly, in this embodiment, a high-resistance element is connected as part of connecting paths between each switching element(FET) and the protecting element 200 connected immediately near the operating region of the switching element. Further, another high-resistance element is placed as part of connecting paths between the adjacent protecting elements 200.

The FET1 side will be specifically described. The first control resistor CR1 is extended from the first control terminal pad C1 to the vicinity of the common input terminal pad I and further passed through the vicinity of the first output terminal pad O1 to be connected to the gate electrode 17 of FET1.

Accordingly, a high-resistance element HR11 is connected as a part of the first control resistor CR1 between FET1 and the first output terminal pad O1. Further, since two protecting elements 200 are respectively connected to the first output terminal pad O1 and the common input terminal pad I, a high-resistance element HR12 is connected as a part of the first control resistor CR1 therebetween. Similarly, high-resistance elements HR21 and HR22 are connected as parts of the second control resistor CR2 of FET2.

Figure 4:
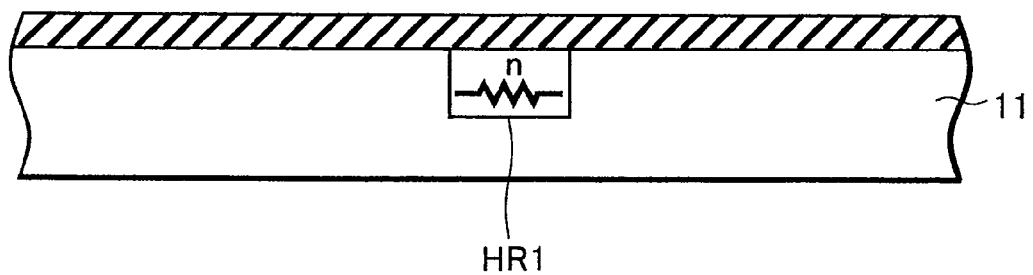
FIG. 4 is a cross-sectional view for explaining the first embodiment of the present invention.

FIG. 4 illustrates a cross-sectional view taken along line c-c of FIG. 2A.

As illustrated in FIG. 4, the high-resistance element HR11 is an n-type impurity region of relatively low concentration (peak concentration: 2 to $4 \times 10^{17}$ cm$^{-3}$) which is comparable to that of the channel layer 12 of the operating region 100. The high-resistance element HR11 has a sheet resistance of approximately 1 kΩ/sq(high sheet resistance). and a resistance value of not less than 5 kΩ (e.g., 10 kΩ). The high-resistance elements HR12, HR21, and HR22 also have similar structures. It should be noted that in this embodiment, the rectangles respectively indicating the high-resistance elements HR11, HR12, HR21, and HR22 have no meaning in terms of a pattern in themselves in FIG. 2A.

Figure 5:
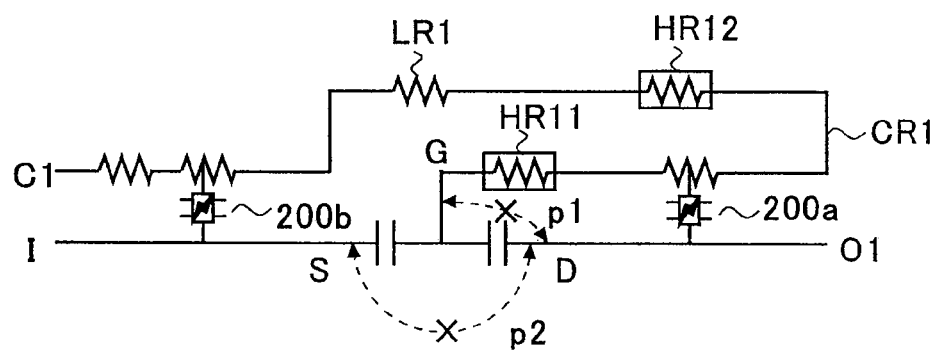
FIG. 5 is a schematic circuit diagram for explaining the first embodiment of the present invention.

FIG. 5 is a schematic circuit diagram for the case where the high-resistance elements are connected. It should be noted that although the FET1 side will be described, the following description also applies to the FET2 side.

The low-resistance element LR1 having a low sheet resistance value is placed near the first output terminal pad O1 and the common input terminal pad I, and the first control terminal pad C1 and the gate terminal G of FET1 are connected by the first control resistor CR1 where the low-resistance element LR1 constitutes most part of the first control resistor CR1. Thus, a protecting element 200a is connected to the first output terminal pad O1, and a protecting element 200b is connected to the common input terminal pad I.

Further, the high-resistance element HR11 is connected as the part of the first control resistor CR1 between the protecting element 200a on the first output terminal pad O1 side and the gate terminal G of FET1. This makes it possible to prevent a high-frequency signal from leaking between the gate terminal G and the drain terminal D of FET1. Accordingly, a path p1 for a high-frequency signal, which has been formed by being caused by the parasitic capacitance of the protecting element 200a heretofore, can be prevented from occurring.

That is, although there is the parasitic capacitance due to the protecting element 200 being connected between the drain terminal D and the gate terminal G of FET1, the path p1 for a high-frequency signal can be prevented from occurring. That is, the electrostatic breakdown voltage between the first output terminal OUT1 and the first control terminal Ctl1 can be improved without deteriorating isolation.

Further, the high-resistance element HR12 is connected as the part of the first control resistor CR1 between the protecting element 200b on the common input terminal pad I side and the protecting element 200a on the first output terminal pad O1 side. This makes it possible to prevent a high-frequency signal from leaking between the drain terminal D and the source terminal S of FET1. Accordingly, a path p2 for a high-frequency signal, which has been formed by being caused by the parasitic capacitances of the protecting elements 200a and 200b heretofore, can be prevented from occurring.

That is, although parasitic capacitances due to the protecting element 200b being connected to the common input terminal pad I and the protecting element 200a being connected to the first output terminal pad O1 exist between the drain terminal D and the source terminal S of FET1, the path p2 for a high-frequency signal can be prevented from occurring. That is, the electrostatic breakdown voltage between the common input terminal I and the first control terminal Ctl1 can be improved without deteriorating isolation.

Moreover, the high-resistance elements HR11, HR12, HR21, and HR22 have impurity concentrations which are comparable to that of the channel layer 12 as described previously. Thus, a higher resistance value can be obtained with a shorter distance. Accordingly, the high-resistance elements HR11, HR12, HR21, and HR22 can be placed in free spaces around pads, and isolation can be prevented from being deteriorated without increasing the chip size. Further, the high-resistance elements HR11, HR12, HR21, and HR22 can be formed by merely changing a mask pattern for forming the channel layer 12 in the process.

In order to obtain a high resistance value (not less than 5 kΩ) using only the low-resistance element LR1 (or LR2), it is necessary to sufficiently reduce the width thereof or to ensure a sufficient length. In actual cases, since there are limitations on the fining of patterning, it is necessary to ensure a desired resistance value by ensuring the length. That is, for example, the resistance value between the protecting element 200a and the gate terminal G of FET1 and that between the protecting elements 200a and 200b are approximately 2 kΩ and 4 kΩ, respectively, similar to those of a known technology. Further, the low-resistance element LR1 (or LR2) having a resistance of not less than 5 kΩ cannot be contained in a space on the path of the first control resistor CR1 (or second control resistor CR2). Accordingly, there arises the necessity of preparing a special space only for placing a resistor of not less than 5 kΩ, and the chip area is increased. Accordingly, a resistor of not less than 5 kΩ is constructed using the high-resistance elements HR11 and HR12 (or HR21 and HR22) as in this embodiment. This eliminates the necessity of particularly increasing the chip size, because the resistor of not less than 5 kΩ can be sufficiently contained in a space on the path of the first control resistor CR1 (or second control resistor CR2).

Here, in FIGS. 1 to 2B, the first control resistor CR1 extends from the first control terminal pad C1 as a start point, approaches the common input terminal pad I, further approaches the first output terminal pad O1, and reaches the gate electrode 17 (gate wiring 120) of FET1. However, the first control resistor CR1 is not limited to this pattern. The embodiment of the present invention can also be similarly carried out even if the first control resistor CR1 has a pattern which extends from the first control terminal pad C1 as a start point, first approaches the first output terminal pad O1, then approaches the common input terminal pad I, and reaches the gate wiring 120.

In this case, although not illustrated, the high-resistance element HR11 is connected between FET1 and the protecting element 200 of the common input terminal pad I, and the high-resistance element HR12 is connected between the respective protecting elements 200 of the common input terminal pad I and the first output terminal pad O1.

This makes it possible to prevent high-frequency signals from leaking between the source terminal S and the gate terminal G and between the source terminal S and the drain terminal D.

Next, a second embodiment will be described with reference to FIGS. 6A to 7B. In the second embodiment, HEMTs (High Electron Mobility Transistors) are adopted as two switching elements. It should be noted that the same portions as those of the first embodiment will not be described.

Figure 6A:
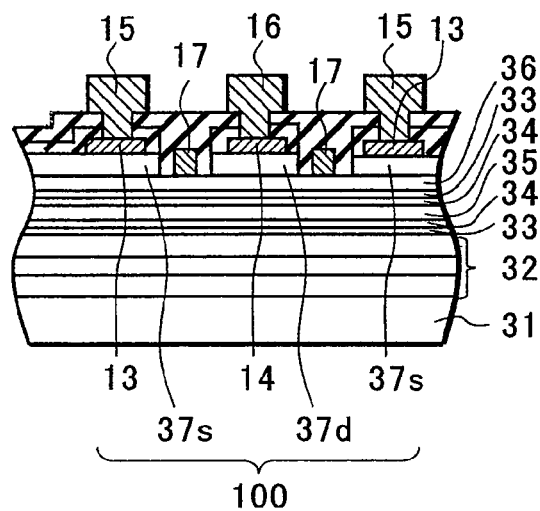
FIGS. 6A and 6B are cross-sectional views for explaining a second embodiment of the present invention.
Figure 6B:
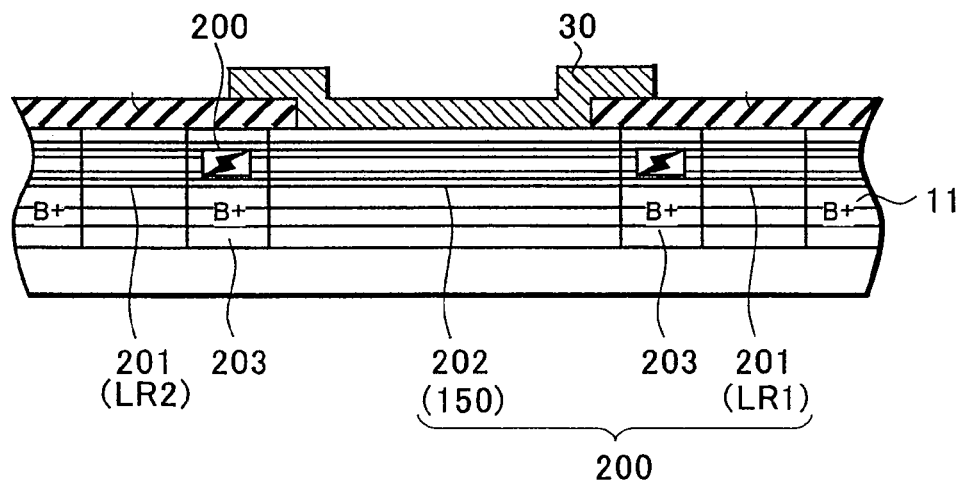

Also in the case of HEMTs, a circuit diagram and a plan view of a switch circuit device are the same as those of FIGS. 1 and 2A. FIGS. 6A and 6B illustrate cross-sectional views taken along lines a-a and b-b of FIG. 2A, respectively.

FIG. 6A illustrates a substrate in which an undoped buffer layer 32 is stacked on a semi-insulating GaAs substrate 31 and in which an n+ AlGaAs layer 33 serving as an electron supply layer, an undoped InGaAs layer 35 serving as a channel (electron transit) layer, and the n+ AlGaAs layer 33 serving as an electron supply layer are stacked in this order on the buffer layer 32. A spacer layer 34 is placed between each electron supply layer 33 and the channel layer 35.

The buffer layer 32 is a high-resistance layer to which no impurity is added, and the thickness thereof is approximately several thousand angstroms. On the upper electron supply layer 33, an undoped AlGaAs layer serving as a barrier layer 36 is stacked to ensure a predetermined breakdown voltage and a predetermined pinch-off voltage. Further, an n+ GaAs layer 37 serving as a cap layer is stacked on as the uppermost layer. An impurity is added to the cap layer 37 at high concentration. The impurity concentration is approximately 1 to $5 \times 10^{18}$ cm$^{-3}$.

For the electron supply layers 33, the barrier layer 36, and the spacer layers 34, materials having band gaps larger than that of the channel layer 35 are used. Further, an n-type impurity (e.g., Si) is added to the electron supply layers 33 at a concentration of approximately 2 to $4 \times 10^{18}$ cm$^{-3}$.

With the above-described structure, electrons originating from the donor impurity of the n+ AlGaAs layers which are the electron supply layers 33 move toward the channel layer 35, whereby a channel serving as a current path is formed. As a result, electrons and donor ions are spatially separated at the heterojunction interface as a boundary. Electrons travel in the channel layer 35. However, since no donor ions exist in the channel layer 35, there is only a small influence of Coulomb scattering. Thus, a high electron mobility can be ensured.

An operating region 100 of the HEMTs is isolated by an insulating region 50 reaching the buffer layer 32. Hereinafter, the operating region 100 of the HEMTs is a semiconductor layer in a region which is isolated by the insulating region 50 and in which source electrodes 13 and 15, drain electrodes 14 and 16, and gate electrodes 17 of the HEMTs are placed. That is, the operating region 100 is a total region including all of semiconductor layers, such as the electron supply layers 33, the channel (electron transit) layer 35, the spacer layers 34, the barrier layer 36, and the cap layer 37, which constitute the HEMTs.

The insulating region 50 is not completely electrically insulator but is a region which is insulated by providing a carrier trap in an epitaxial layer by the implantation of impurity (B+) ions. That is, although an impurity also exists as the epitaxial layer in the insulating region 50, the impurity is inactivated by the implantation of B+ for insulation.

That is, the operating region 100 of the HEMTs is isolated by forming the insulating region 50 in the outer periphery of the region indicated by dashed-dotted lines of FIG. 2A.

As illustrated in FIG. 6A, in the operating region 100, the cap layer 37 to which an impurity is added at high concentration is partially removed, thus providing source regions 37s and a drain region 37d. The source electrodes 13 and the drain electrode 14 which are formed by an ohmic metal layer 10 are connected to the source regions 37s and the drain region 37d. In a layer thereon, the source and drain electrodes 15 and 16 are formed by a pad metal layer 30.

Further, the cap layer 37 in a portion of the operating region 100 in which the gate electrodes 17 are placed is removed by etching, whereby the undoped AlGaAs layer 36 is exposed. Thus, the gate electrodes 17 are formed in which a gate metal layer 20 forms a Schottky contact to the undoped AlGaAs layer 36.

The epitaxial structures of the HEMTs include the cap layer 37. The impurity concentration of the cap layer 37 is as high as approximately 1 to $5 \times 10^{18}$ cm$^{-3}$. Accordingly, it can be said that a region in which the cap layer 37 is placed is an impurity region of high concentration in terms of functions.

That is, in the case of the HEMTs, peripheral impurity regions 150 around pads and wirings are also isolated by the insulating regions 50. Further, a first control resistor CR1 (or a second control resistor CR2) is also isolated by the insulating region 50 while a distance (length) and a width are ensured so that the first control resistor CR1 (or the second control resistor CR2) has a desired resistance value.

In this embodiment, impurity regions for the case of the HEMTs are conductive regions which are not insulated by the implantation of B+.

FIG. 6B is a cross-sectional view taken along line b-b of FIG. 2A.

As in the first embodiment, low-resistance elements LR1 and LR2 respectively constituting the first and second control resistors CR1 and CR2 are placed so as to be spaced from the peripheral impurity region 150 of a common input terminal pad I by 4 μm (see FIG. 2A).

Thus, the low-resistance element LR1 (or LR2) serves as a first conduction region (a first n+ region) 201 of a protecting element 200, and the peripheral impurity region 150 adjacent thereto serves as a second conduction region (a second n+ region) 202 of the protecting element 200. Here, as described previously, in the case of the HEMTs, conductive region s (impurity regions) are isolated by forming the insulating regions 50 into desired patterns. That is, the insulating region 50 is placed around an impurity region, and this insulating region 50 becomes an insulating region 203 of the protecting element 200.

That is, with reference to FIG. 1 and FIG. 3B, the protecting element 200 having an n+/i/n+ structure is connected between a common input terminal IN and a control terminal Ctl1, i.e., between a source terminal S and a gate terminal G (or a drain terminal D and the gate terminal G) of FET1. Thus, the electrostatic breakdown voltage of the switch MMIC can be greatly improved.

Further, the low-resistance element LR1 is placed near a first output terminal pad O1. Thus, the protecting element 200 is connected between the first control terminal Ctl1 and a first output terminal OUT1. This makes it possible to improve the minimum value of the electrostatic breakdown voltage of the switch MMIC.

Further, high-resistance elements HR11 and HR12 are connected as parts of the first control resistor CR1, and high-resistance elements HR21 and HR22 are connected as parts of a second control resistor CR2. The FET2 side is similar to the FET1 side, and therefore will not be described below.

The high-resistance element HR11 is connected between the gate electrode (gate wiring 120) of FET1 and the protecting element 200 immediately near FET1 in series with the low-resistance element LR1 constituting the first control resistor CR1.

On the other hand, the high-resistance element HR12 is connected in series with the low-resistance element LR1 between the adjacent protecting elements 200 respectively connected to the first output terminal pad O1 and the common input terminal pad I.

Figure 7A:
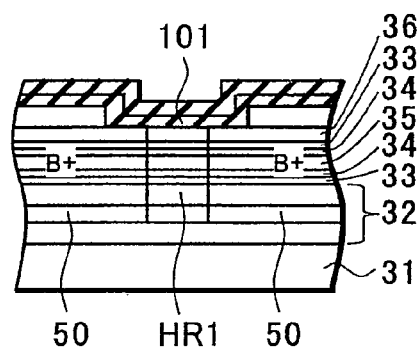
FIGS. 7A and 7B are cross-sectional views for explaining the second embodiment of the present invention.
Figure 7B:
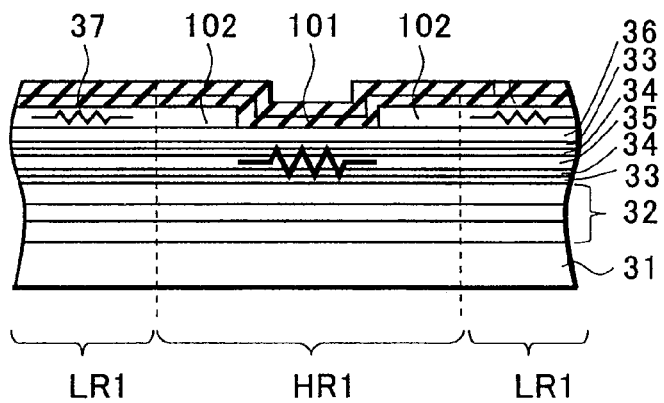

Referring to FIGS. 7A and 7B, the high-resistance elements of the second embodiment will be described. FIG. 7A is a cross-sectional view taken along line c-c of FIG. 2A, and FIG. 7B is a cross-sectional view taken along line d-d of FIG. 2A. Further, since the high-resistance elements HR11, HR12, HR21, and HR22 have similar structures, the high-resistance element HR11 will be described below.

The high-resistance element HR11 of this embodiment is a third conduction region isolated by the insulating region 50 and is constituted by a region in which the semiconductor layer under the cap layer 37 is exposed by removing the cap layer 37.

That is, the high-resistance element HR11 has a recess portion 101 in which the cap layer 37 is etched, and the cap layer 37 which serves as contact portions 102 for connection is left at both ends of the recess portion 101. The contact portions 102 are regions for continuously connecting directly to the cap layer 37 of the low-resistance element LR1 as illustrated in FIG. 7B or for connecting to wirings in the case where resistance element electrodes (not shown) are provided. In the case where the resistance element electrodes are provided, the resistance element electrodes can be formed by the ohmic metal layer 10, which is a first metal layer of the HEMTs, and the pad metal layer 30, which is a third metal layer thereof, similarly to the source and drain electrodes.

It should be noted that in the case where the contact portions 102 of the high-resistance element HR11 are connected to the low-resistance element LR1 as illustrated in FIG. 7B, the boundaries thereof are unclear. Here, minimum regions (here, e.g., regions having lengths of approximately 3 μm) required for the resistance element electrodes to come into contact therewith are regarded as the contact portions 102.

Further, in the case illustrated in FIG. 7B, the barrier layer 36 is exposed at a bottom portion of the recess portion 101. Thus, by providing the recess portion 101 in which the barrier layer 36 is exposed, the contact portions 102 and the channel layer 35 serve as a current path of the high-resistance element HR11, and the channel layer 35 substantially serves as a resistive layer of the high-resistance element HR11. Further, since the channel layer 35 has a sheet resistance (e.g., 400 Ω/sq.) several times higher than that of the cap layer 37, the high-resistance element HR11 having a high resistance value and a short length can be obtained. In this embodiment, the high-resistance element HR11 having a sheet resistance Rs of approximately 400 Ω/sq. is obtained by providing the recess portion 101. The recess portion 101 has a length of, for example, approximately 50 μm.

Connecting the above-described high-resistance element makes it possible to cut a path for a high-frequency signal and to prevent isolation from deteriorating.

On the other hand, the low-resistance element LR1 is isolated by the insulating region 50 as illustrated in FIG. 7A while a required distance (length) and a required width are ensured (See FIG. 7B). In the low-resistance element LR1, the cap layer 37 is left as it is. Accordingly, the contact portions 102 of the high-resistance element HR11 and the cap layer 37 become continuous.

The structure of the conductive region (impurity region) constituting the low-resistance element LR1 is the same as the epitaxial structures of the HEMTs. Accordingly, the low-resistance element LR1 includes the cap layer 37 (having an impurity concentration of approximately 1 to $5 \times 10^{18}$ cm$^{-3}$), and can be said to be an impurity region of high concentration in terms of functions.

Since the cap layer 37 has a high impurity concentration and a large thickness, the cap layer 37 becomes a major current path of the low-resistance element LR1. Here, the sheet resistance Rs is assumed to be approximately 100 Ω/sq.

In order to obtain a high resistance value (not less than 5 kΩ) using only the low-resistance element LR1, it is necessary to sufficiently reduce the width thereof or to ensure a sufficient length. In actual cases, since there are limitations on the fining of patterning, it is necessary to ensure a desired resistance value by ensuring the length. Accordingly, if a resistance increases, a resistor cannot be contained in a space between pads and another components of the switch MMIC on the chip, and there arises the necessity of preparing a special space only for placing the resistor. Thus, there is the problem that the chip area is increased.

However, in this embodiment, a resistor of not less than 5 kΩ can be sufficiently contained in a space on the path of the first control resistor CR1 by adopting the high-resistance elements HR11 and HR12 in which the channel layer 35 having a high sheet resistance is used as a substantial resistive layer by removing the cap layer 37. That is, the chip area can be prevented from increasing, and a leak path for a high-frequency signal can be cut off.

FIGS. 8A to 8C illustrate a third embodiment of the present invention. FIG. 8A is a cross-sectional view taken along line d-d of FIG. 2A, FIG. 8B is a cross-sectional view taken along line b-b thereof, and FIG. 8C is a cross-sectional view taken along line a-a thereof. The third embodiment has a structure in which an InGaP layer 40 is provided on a barrier layer 36 which is the same as the second embodiment and in which the InGaP layer 40 is exposed at bottom portions of a recess portions 101 of high-resistance elements HR11, HR12, HR21, and HR22.

Thus, the barrier layer 36 which is the AlGaAs layer that is prone to being oxidized is covered with the InGaP layer 40 of which surface state is stable. Accordingly, the high-resistance elements having more favorable reliability than those of the second embodiment can be obtained.

Further, when the recess portions 101 are formed, a GaAs cap layer 37 can be easily selectively etched by wet etching with very high selectivity over the InGaP layer. Accordingly, the inexpensive recess portions 101 having good reproducibility can be formed.

Moreover, in this case, in an operating region 100, the barrier layer 36 is exposed by removing the InGaP layer 40, thus forming a gate electrodes 17. At this time, the barrier layer 36 can be protected by the InGaP layer 40 immediately before the evaporation of a gate metal layer 20. Accordingly, characteristics of the HEMTs can be improved.

FIGS. 9A to 9C illustrate a fourth embodiment of the present invention. FIG. 9A is a cross-sectional view taken along line d-d of FIG. 2A, FIG. 9B is a cross-sectional view taken along line b-b thereof, and FIG. 9C is a cross-sectional view taken along line a-a thereof.

In the fourth embodiment, an InGaP layer 40 is provided on a barrier layer 36 which is the same as the second embodiment, and a recess portions 101 are provided by etching a cap layer 37 and the InGaP layer 40. That is, the fourth embodiment has a structure in which the barrier layer 36 is exposed at bottom portions of the recess portions 101 of high-resistance elements HR11, HR12, HR21, and HR22.

In the third embodiment in which the InGaP layer 40 is similarly provided, since the InGaP layer 40 of high concentration also constitutes a resistive layer as well as a channel layer 35, there is the problem that the sheet resistance is slightly lower than that of the second embodiment. On the other hand, in the fourth embodiment, since the InGaP layer 40 of high concentration is also removed in the recess portions 101, a resistive layer including almost only the channel layer 35 can be substantially obtained as in the second embodiment. Accordingly, the sheet resistance is comparable to that of the second embodiment. Thus, the sheet resistance value can be improved compared to that of the third embodiment. That is, a higher resistance value can be obtained with the same length and width as those of the third embodiment.

Further, in this case, in an operating region 100, the barrier layer 36 is exposed by removing the InGaP layer 40, thus forming gate electrodes 17. The barrier layer 36 can be protected by the InGaP layer 40 immediately before the evaporation of a gate metal layer 20. Accordingly, characteristics of the HEMTs can be improved.

Embodiments described below are switch MMICs having different patterns. It should be noted that the same components as those of FIG. 2A are denoted by the same reference numerals.

Figure 10:
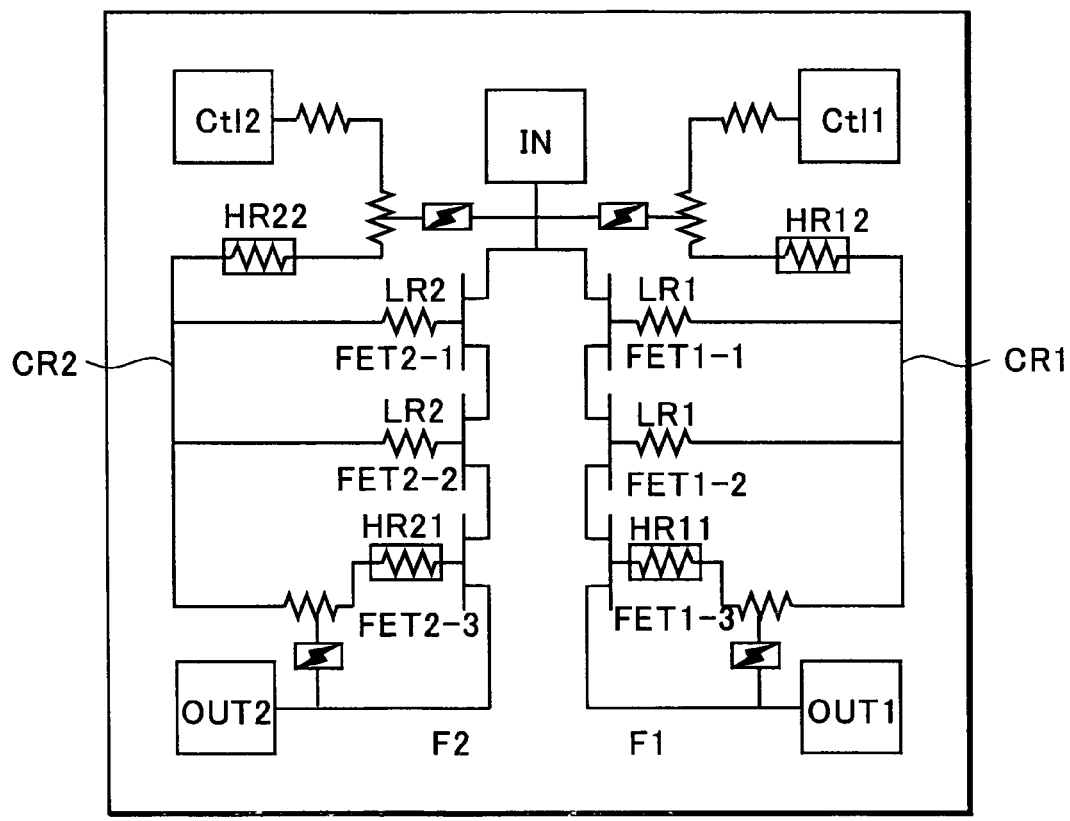
FIG. 10 is a circuit diagram for explaining a fifth embodiment of the present invention.

FIGS. 10 to 12C illustrate high-power SPDT switch MMICs including two switching elements, each of which includes a plurality of stages of FETs connected. FIG. 10 is a circuit diagram illustrating one example of a switch MMIC of a fifth embodiment.

The switch MMIC includes a first FET group F1 and a second FET group F2, each of which includes three stages of FETs connected in series. Further, a source electrode (or a drain electrode) of the FET at one end of the first FET group F1 and a source electrode (or a drain electrode) of the FET at one end of the second FET group F2 are connected to a common input terminal IN. Moreover, gate electrodes of the three FETs of the first FET group F1 are respectively connected to a first control terminal Ctl1 through a first control resistor CR1, and three gate electrodes of the second FET group F2 are respectively connected to a second control terminal Ctl2 through a second control resistor CR2. Furthermore, a drain electrode (or a source electrode) of the FET at the other end of the first FET group F1 is connected to a first output terminal OUT1, and a drain electrode (or a source electrode) of the FET at the other end of the second FET group F2 is connected to a second output terminal OUT2.

Control signals applied to the first and second terminals Ctl1 and Ctl2 are complementary signals. Of the FET groups, one to which an H-level signal is applied is turned on, whereby a high-frequency analog signal inputted to the common input terminal IN is transmitted to either of the output terminals. The resistors are placed in order to prevent high-frequency signals from leaking through the gate electrodes to the DC potentials of the control terminals Ctl1 and Ctl2, which are AC grounded.

As described above, in the first FET group F1 including a plurality of stages of FETs connected in series, the source electrode of FET1-1 as a source of the FET group F1 is connected to the common input terminal IN. The gate electrodes of FET1-1, FET1-2, and FET1-3 as gates of the FET group F1 are collectively connected to the control terminal Ctl1. The drain electrode of FET1-3 as a drain of the FET group F1 is connected to the output terminal OUT1. The second FET group F2 has a similar configuration.

Figure 11:
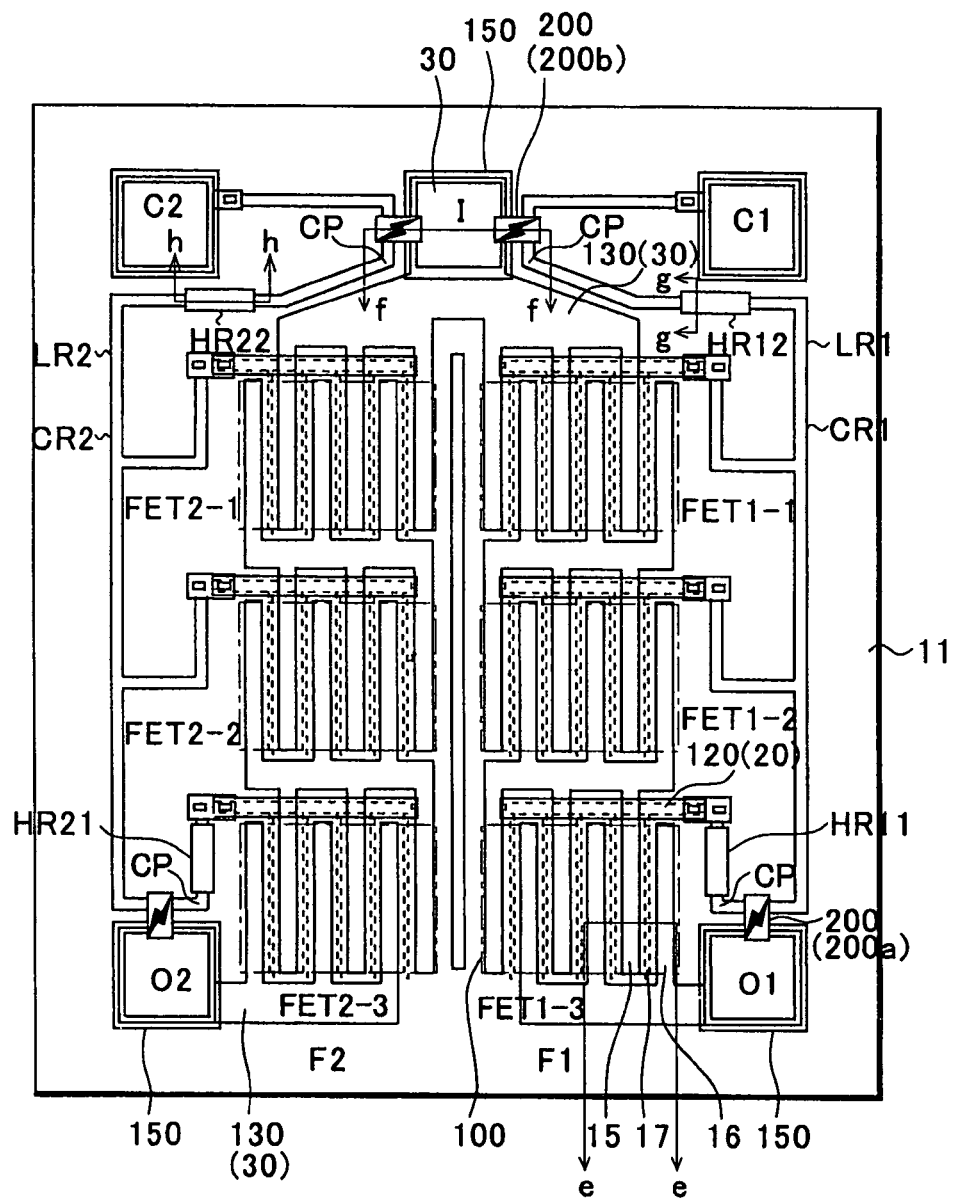
FIG. 11 is a plan view for explaining the fifth embodiment of the present invention.

FIG. 11 is a plan view of a switch MMIC in which the circuit of FIG. 10 is integrated into one chip. The two FET groups (first and second FET groups F1 and F2) which perform switching are placed in a GaAs substrate 11. The first FET group F1 includes, for example, three FETs FET1-1, FET1-2, and FET1-3 connected in series. The second FET group F2 includes FET2-1, FET2-2, and FET2-3 connected in series. The first control resistor CR1 and the second control resistor CR2 are connected to the six gate electrodes constituting each of the FET groups, respectively. Electrode pads I, O1, and O2 respectively connected to the common input terminal IN and the first and second output terminals OUT1 and OUT2, and two electrode pads C1 and C2 respectively connected to the first and second control terminals Ctl1 and Ctl2, are provided in a peripheral portion of the substrate 11.

Gate wirings 120 of a second metal layer indicated by dotted lines are constituted by a gate metal layer (e.g., Pt/Mo) 20 formed simultaneously with the formation of gate electrodes 17 of the FETs. Pad wirings 130 of a third layer indicated by full lines are constituted by a pad meal layer (Ti/Pt/Au) 30 which connects components and forms the electrode pads. An ohmic metal layer (AuGe/Ni/Au), which is a first metal layer, forms an ohmic contact to the substrate 11. In FIG. 11, the ohmic metal layer is not illustrated because it is overlapped by the pad metal layer 30.

The first FET group F1 is placed to be symmetric with the second FET group F2 with respect to a center line of the chip, and the first and second FET groups F1 and F2 have similar configurations. Accordingly, the first FET group F1 will be described below. In FET1-1, three comb-teeth-like portions of the pad metal layer 30 which are extended from the upper side constitute a second source electrode 15 (or a second drain electrode 16) connected to the common input terminal pad I. Under the second source electrode 15, there is a first source electrode (or a first drain electrode) formed by the ohmic metal layer. Further, three comb-teeth-like portions of the pad metal layer 30 which are extended from the lower side constitute a second drain electrode 16 (or a second source electrode) of FET1-1. Under the second drain electrode 16, there is a first drain electrode (or a first source electrode) formed by the ohmic metal layer. The second source and drain electrodes 15 and 16 are placed in a shape in which the comb-teeth-like portions are engaged. A gate electrode 17 formed by the gate metal layer 20 is placed therebetween in a shape having five comb-teeth-like portions.

Operating regions 100 are formed in regions indicated by dashed-dotted lines by, for example, implanting ions into the GaAs substrate 11. Alternatively, the operating regions 100 are formed in the regions indicated by the dashed-dotted lines by stacking a plurality of semiconductor layers on the GaAs substrate 11 and being isolated by insulating regions 50.

In FET1-2, three second source electrodes 15 extended from the upper side are connected to the second drain electrodes 16 of FET1-1. Here, the second source electrodes 15 are merely via points for a high-frequency signal, and generally do not need to be led to the outside. Accordingly, no pad is provided for these electrodes. Further, three second drain electrodes 16 extended from the lower side are connected to the second source electrodes 15 of FET1-3. The second drain electrodes 16 are also merely via points for a high-frequency signal, and generally do not need to be led to the outside. Accordingly, no pad is provided for these electrodes. Under the second source and drain electrodes 15 and 16, there is the ohmic metal layer. The second source and drain electrodes 15 and 16 are placed in a shape in which the comb-teeth-like portions are engaged. A gate electrode 17 formed by the gate metal layer 20 is placed therebetween in a shape having five comb-teeth-like portions. Compared to a switch circuit device including one stage of an FET, the switch circuit device including a plurality of stages of FETs connected in series is a high-power switch circuit device because each FET group can withstand a larger voltage amplitude when the FET group is off. In this case, source and drain electrodes of the FETs which become junctions when the FETs are connected in series generally do not need to be led to the outside. Accordingly, there is no need to provide pads for such source and drain electrodes.

In FET1-3, three comb-teeth-like portions of the pad metal layer 30 which are extended from the upper side constitute a second source electrode 15. Under the second source electrode 15, there is a first source electrode (or a first drain electrode) formed by the ohmic metal layer. Further, three comb-teeth-like portions of the pad metal layer 30 which are extended from the lower side constitute a second drain electrode 16 connected to the output terminal pad O1. Under the second drain electrode 16, there is a first drain electrode (or a first source electrode) formed by the ohmic metal layer. The second source and drain electrodes 15 and 16 are placed in a shape in which the comb-teeth-like portions are engaged. A gate electrode 17 formed by the gate metal layer 20 is placed therebetween in a shape having five comb-teeth-like portions.

It should be noted that a cross-sectional view taken along line e-e in FIG. 11 is similar to FIG. 2B in the case of FETs in which the operating regions 100 are formed by ion implantation or similar to FIG. 6A in the case of HEMTs.

The comb-teeth-like portions of the gate electrodes 17 of the FETs of the first FET group F1 are respectively bundled by the gate wirings 120 formed by the gate metal layer 20 outside the operating region 100, and are connected to the first control terminal pad C1 through the first control resistor CR1.

The first control resistor CR1 includes a low-resistance element LR1. High-resistance elements HR11 and HR12 are connected in series with portions of the low-resistance element LR1.

Further, the low-resistance element LR1 of the first control resistor CR1 is placed along and near the common input terminal pad I. Thus, a protecting element 200 is connected between the common input terminal pad I and the first control terminal pad C1. This protecting element 200 between the common input terminal pad I and the first control terminal pad C1 is referred to as a protecting element 200b. It should be noted that a cross-sectional view taken along line f-f of FIG. 11 is similar to FIG. 3C or 6B. Thus, electrostatic breakdown voltage can be greatly improved.

Moreover, the low-resistance element LR1 is placed near the first output terminal pad O1. Thus, another protecting element 200 is connected between the first control terminal Ctl1 and the first output terminal OUT1. The other protecting element 200 between the first output terminal pad O1 and the first control terminal pad C1 is referred to as a protecting element 200a. Thus, it is possible to improve the minimum value of the electrostatic breakdown voltage of the switch circuit device.

The high-resistance element HR11 is connected in series with the low-resistance element LR1 constituting the first control resistor CR1. Further, the high-resistance element HR11 is connected between the gate electrode (gate wiring 120) of a switching element (FET1-3) and the connection point CP of the protecting element 200a immediately near the switching element (FET1-3).

The high-resistance element HR12 is connected in series with the low-resistance element LR1 constituting the first control resistor CR1. Further, the high-resistance element HR12 is connected between the gate electrode (gate wiring 120) of FET1-1 and the connection point CP of the protecting element 200b immediately near FET1-1.

Similarly, high-resistance elements HR21 and HR22 are connected as parts of the second control resistor CR2.

A cross-sectional view of the high-resistance element HR11 (or HR12) which is taken along line g-g of FIG. 11 is similar to FIG. 4 or 7A. That is, the high-resistance element HR11 for the case (FIG. 4) of FETs in which the operating regions 100 are formed by ion implantation, is formed to have a resistance value of not less than 5 kΩ by implanting ions of the same impurity as that forming a channel layer 12 into the GaAs substrate 11 so that a peak concentration comparable to that of the channel layer 12 is obtained.

On the other hand, the high-resistance element HR11 for the case (FIG. 7A) of HEMTs is isolated from the surrounding region by an insulating region 50 and formed to have a resistance value of not less than 5 kΩ by forming a recess portion 101 by etching a cap layer 37. In the case of the HEMTs, a cross-sectional view taken along line h-h of FIG. 11 is similar to FIG. 7B. As illustrated in FIG. 7B, a semiconductor layer under the recess portion 101 is exposed in the recess portion 101. Since semiconductor layers under a cap layer 37 serve as resistive layers, a high resistance value can be obtained with a short distance.

If a resistor of not less than 5 kΩ includes only the low-resistance element LR1, the resistor cannot be contained in a space on the path of the first control resistor CR1. A resistor of not less than 5 kΩ can be placed without particularly increasing the chip size by constructing the resistor using the high-resistance elements HR11 and HR12 as in this embodiment.

Figure 12A:
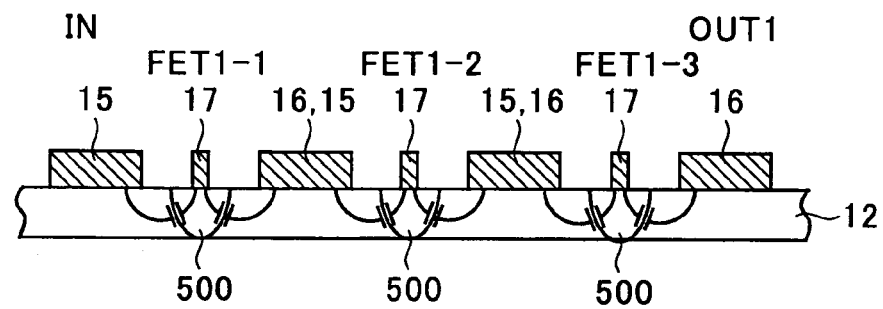
FIGS. 12A to 12C are a schematic cross-sectional view, a schematic circuit diagram, and a schematic circuit diagram for explaining the fifth embodiment of the present invention, respectively.
Figure 12B:
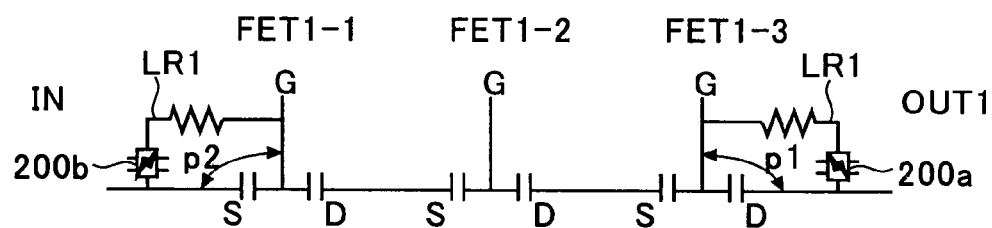
Figure 12C:
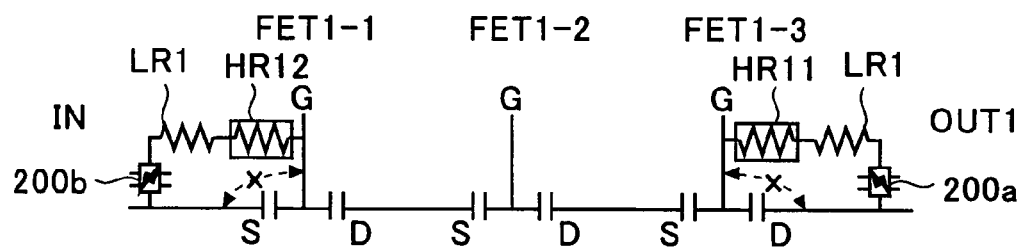

FIGS. 12A to 12C are diagrams each illustrating an overview of a switch MMIC in operation. The switch MMIC is similar to that of FIG. 11. However, FIG. 12A is a diagram for the case where the protecting elements 200 are not connected, i.e., the case where the first control resistor CR1 is placed without being close to each pad (I and O1). FIG. 12B is a diagram for the case where the protecting elements 200a and 200b are connected and where the first control resistor CR1 includes only the low-resistance element LR1. Further, FIG. 12C is a diagram for the case where the protecting elements 200 are connected as in this embodiment and where the high-resistance elements HR11 and HR12 are connected as parts of the first control resistor CR1.

FIG. 12A is a schematic cross-sectional view illustrated by extracting part of FET1-1, FET1-2, and FET1-3 for the case where an electrical path between the common input terminal IN and the first output terminal OUT1 is off, i.e., the first FET group F1 side is off. Further, in actual cases, this switch MMIC has a cross-sectional structure similar to that of FIG. 2B or 6A. However, FIG. 12A is a schematic diagram for explaining the state of operation, and therefore does not completely coincide with the electrode structure and the structure of the operating region 100 illustrated in FIG. 2B or 6A.

In each operating region 100 indicated by dashed-dotted lines in FIG. 11, the channel layer 12 is provided, and n-type impurity-diffused regions of high concentration which form a source and drain regions 18 and 19 are provided on both sides of the channel layer 12. On the surfaces of the source and drain regions 18 and 19, for example, the source electrode 15 on the common input terminal IN side and the drain electrode 16 on the first output terminal OUT1 side are placed. On the surface of the channel layer 12 therebetween, the gate electrode 17 is provided to form a Schottky junction with part of the channel layer 12.

Further, when the first FET group F1 is off, a depletion layer 500 spreads in the channel layer 12 under the gate electrodes 17 as illustrated in FIG. 12A and reaches a bottom portion of the channel layer 12 to pinch off the channel. Thus, the channel layer 12 is cut off.

In the switch MMIC, it is necessary to prevent signals from leaking between the terminals of the FETs (FET1) on an off side. To do so, it is desirable that the channel layer 12 is sufficiently cut off with the depletion layer 500 as illustrated in FIG. 12A to improve isolation.

Further, in this case, the value of isolation between the common input terminal IN and the first output terminal OUT1 is determined by the combined capacitance of six capacitances connected in series.

However, if the protecting elements 200a and 200b are connected using the first control resistor CR1 including only the low-resistance element LR1 having a low sheet resistance as illustrated in FIG. 12B, a portion of the resistor between each protecting element 200a and 200b and the corresponding gate electrode is short in length and has a resistance value of not more than 5 kΩ. Accordingly, as indicated by arrows in FIG. 12B, a path p1 and a path p2 for high-frequency signals occur by the low-resistance element LR1 and the parasitic capacitances of the protecting elements 200. Thus, isolation is deteriorated.

Accordingly, as illustrated in FIG. 12C, the high-resistance elements HR11 and HR12 are connected as parts of the first control resistor CR1. For example, the high-resistance element HR11 is connected between the connection point CP of the protecting element 200a connected to the output terminal pad O1 and the gate electrode 17 of FET1-3 immediately near the protecting element 200a. This makes it possible to prevent a high-frequency signal from leaking between a gate terminal G and a drain terminal D of FET1-3.

Further, the high-resistance element HR12 is connected between the connection point CP of the protecting element 200b connected to the common input terminal pad I and the gate electrode 17 of FET1-1 immediately near the protecting element 200b. This makes it possible to prevent a high-frequency signal from leaking between the gate terminal G and a source terminal S of FET1-1.

Thus, the resistance value of the first control resistor CR1 between each protecting element 200 and the corresponding gate electrode 17 becomes not less than 5 kΩ. That is, although there are parasitic capacitances due to the protecting elements 200 being connected, the paths p1 and p2 for high-frequency signals can be prevented from occurring. Accordingly, electrostatic breakdown voltage can be improved without deteriorating isolation. It should be noted that since the switch MMIC of this fifth embodiment includes three stages of FETs, the distance between the protecting elements 200a and 200b is sufficiently large. Accordingly, a resistance value of not less than 5 kΩ, which the resistor therebetween has, can be ensured with a structure including only the low-resistance element LR1.

That is, even if the high-resistance element HR12 (or HR22) is not connected between the protecting elements 200a and 200b as in the first embodiment, there is no deterioration in isolation between the first output terminal pad O1 and the common input terminal pad I due to the protecting elements 200a and 200b being connected.

It should be noted that although HR12 is connected between the protecting elements 200a and 200b in this embodiment, the purpose of this is to prevent a high-frequency signal from leaking between the gate terminal G and the source terminal S of FET1-1 as described previously, which is different from HR12 of the first embodiment.

Further, the substrate structure and the high-resistance elements HR11, HR12, HR21, and HR22 for the case of the HEMTs may be similar to those of the third or fourth embodiment.

Figure 13:
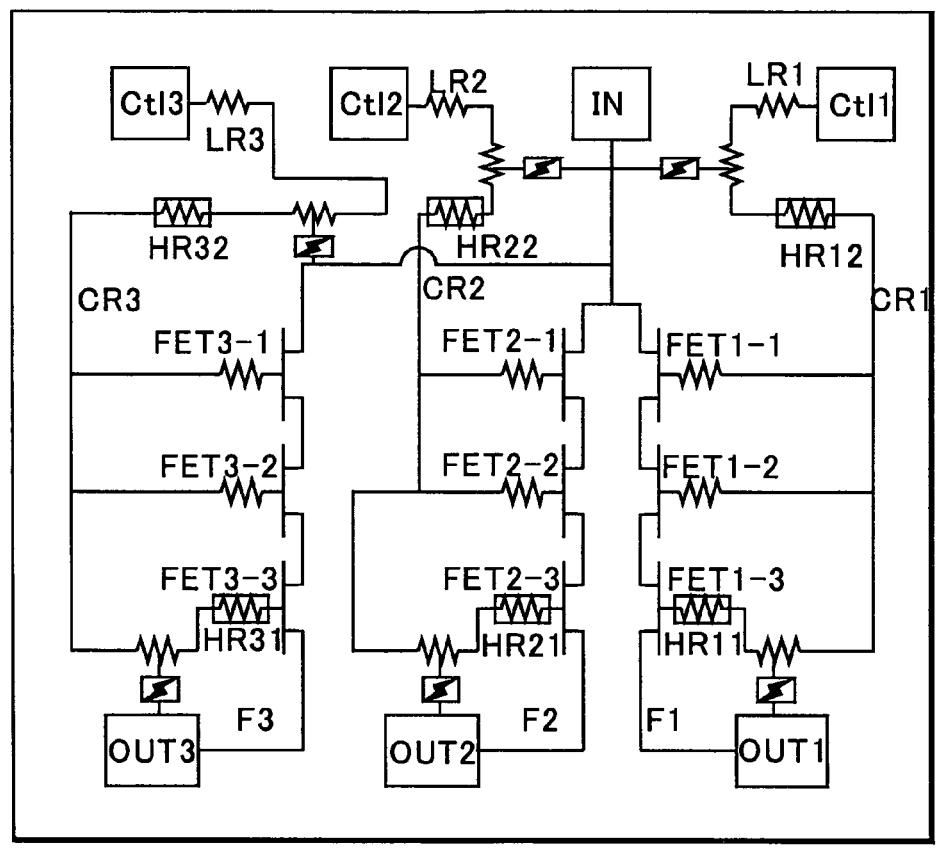
FIG. 13 is a circuit diagram for explaining a sixth embodiment of the present invention.
Figure 14A:
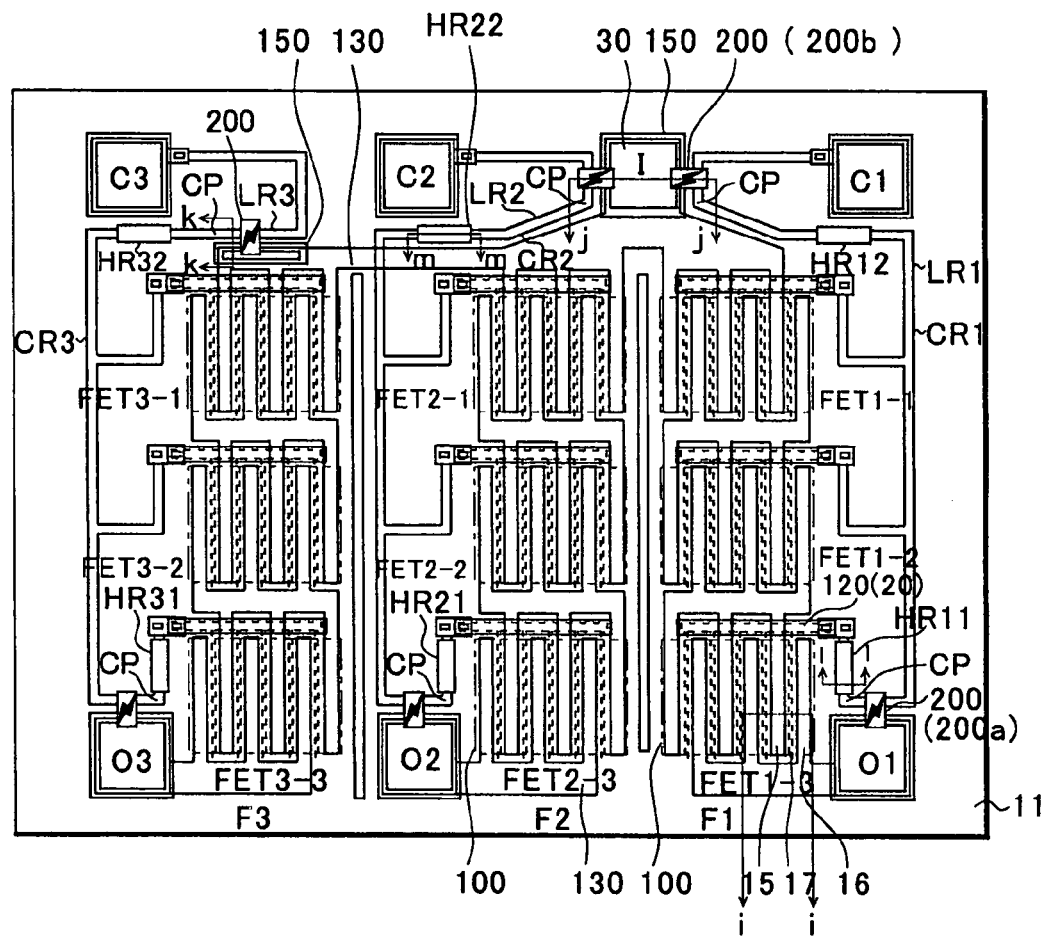
FIGS. 14A and 14B are a plan view and a cross-sectional view for explaining the sixth embodiment of the present invention, respectively.
Figure 14B:
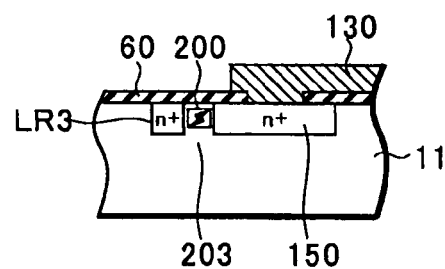
Figure 15:
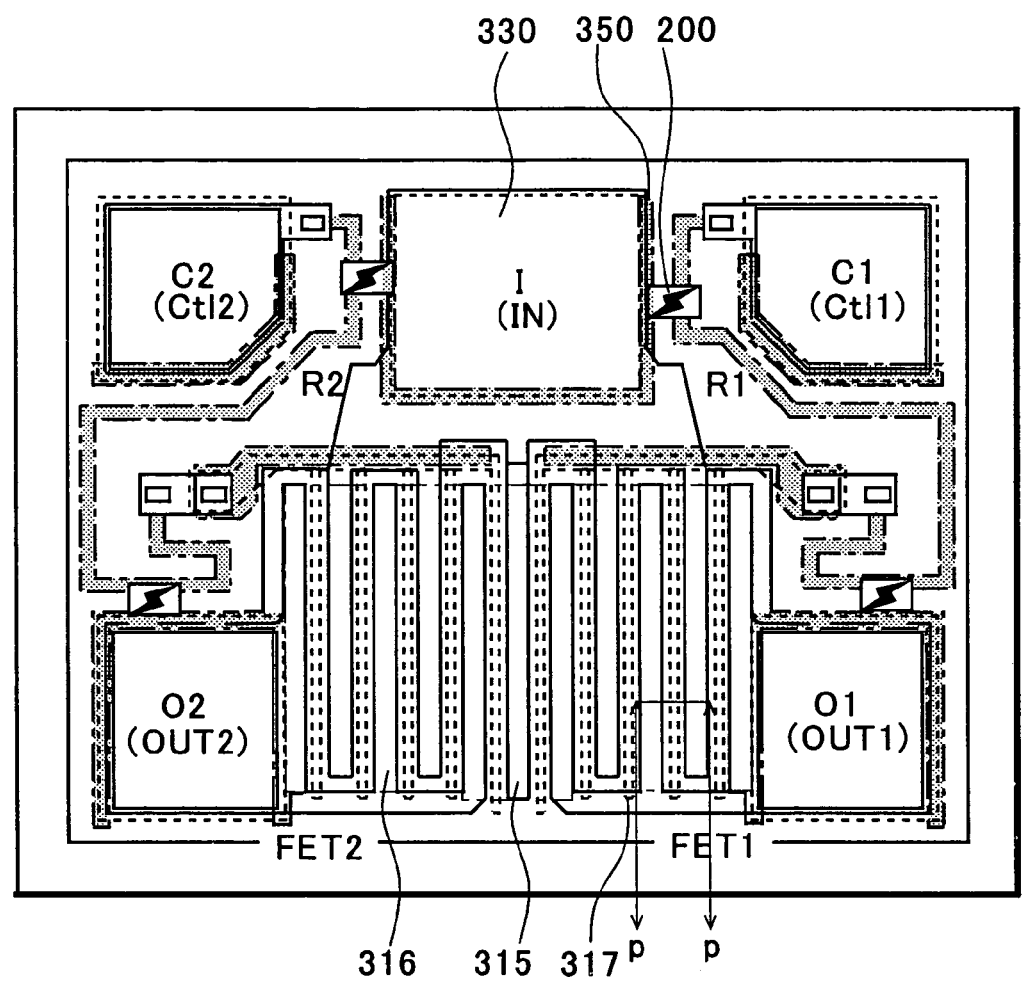
FIG. 15 is a plan view for explaining a conventional technology.
Figure 16:
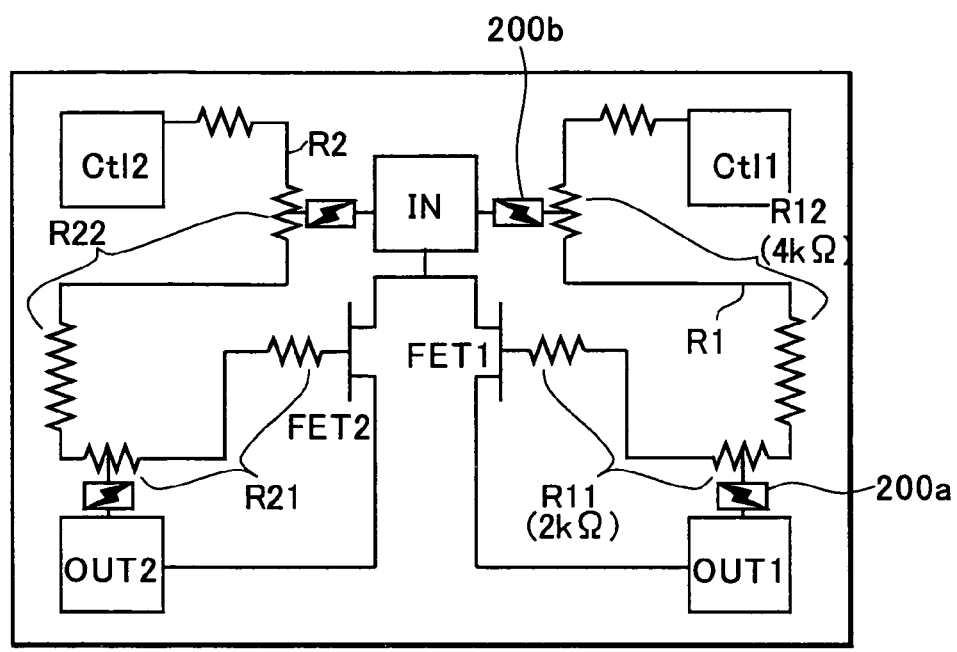
FIG. 16 is a circuit diagram for explaining the conventional technology.
Figure 17A:
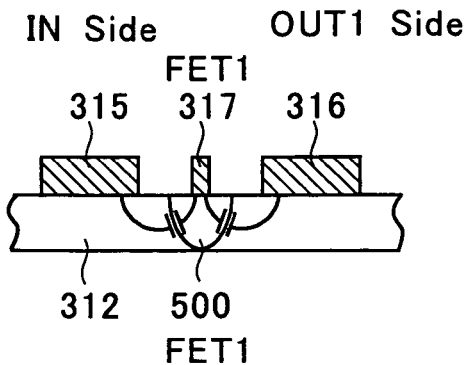
FIGS. 17A to 17C are a schematic cross-sectional view, an equivalent circuit diagram, and a schematic circuit diagram for explaining the conventional technology, respectively.
Figure 17B:
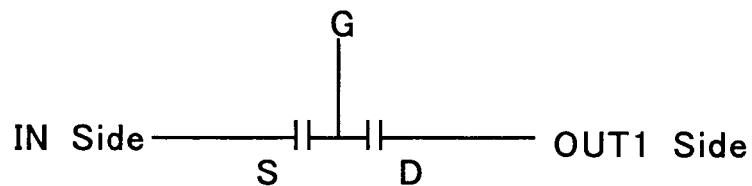
Figure 17C:
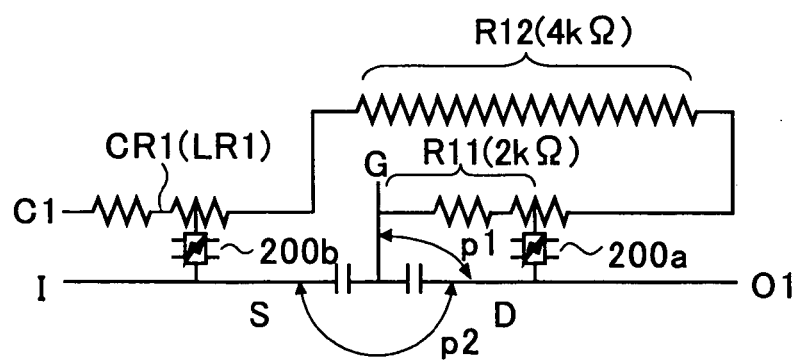

FIGS. 13 to 14B illustrate a single-pole three-throw (SP3T) switch including three switching elements. FIG. 13 is a circuit diagram illustrating one example of a switch MMIC of a sixth embodiment.

The switch MMIC includes a first FET group F1, a second FET group F2, and a third FET group F3, each of which includes three stages of FETs connected in series and serves as a switching element. Further, a source electrode (or a drain electrode) of the FET at one end of the first FET group F1, a source electrode (or a drain electrode) of the FET at one end of the second FET group F2, and a source electrode (or a drain electrode) of the FET at one end of the third FET group F3 are connected to a common input terminal IN. Moreover, gate electrodes of the three FETs of the first FET group F1 are respectively connected to a first control terminal Ctl1 through a first control resistor CR1, and three gate electrodes of the second FET group F2 are respectively connected to a second control terminal Ctl2 through a second control resistor CR2. Furthermore, three gate electrodes of the third FET group F3 are respectively connected to a third control terminal Ctl3 through a third control resistor CR3.

Further, a drain electrode (or a source electrode) of the FET at the other end of the first FET group F1 is connected to a first output terminal OUT1. Moreover, a drain electrode (or a source electrode) of the FET at the other end of the second FET group F2 is connected to a second output terminal OUT2, and a drain electrode (or a source electrode) of the FET at the other end of the third FET group F3 is connected to a third output terminal OUT3.

Of control signals applied to the first, second, and third control terminals Ctl1, Ctl2, and Ctl3, one is at an H level, and the others are at an L level. Of the FET groups, one to which an H-level signal is applied is turned on, whereby a high-frequency analog signal inputted to the common input terminal IN is transmitted to corresponding one output terminal. The resistors are placed in order to prevent high-frequency signals from leaking through the gate electrodes to the DC potentials of the control terminals Ctl1, Ctl2, and Ctl3, which are AC grounded.

FIGS. 14A and 14B are diagrams of a switch MMIC in which the circuit of FIG. 13 is integrated into one chip. FIG. 14A is a plan view, and FIG. 14B is a cross-sectional view taken along line k-k of FIG. 14A.

The three FET groups which perform switching are placed in a GaAs substrate 11. The first FET group F1 includes, for example, three FETs FET1-1, FET1-2, and FET1-3 connected in series. The second FET group F2 includes FET2-1, FET2-2, and FET2-3 connected in series. The third FET group F3 includes FET3-1, FET3-2, and FET3-3 connected in series.

The first control resistor CR1, the second control resistor CR2, and the third control resistor CR3 are connected to nine gate electrodes 17 constituting each of the FET groups, respectively. Further, electrode pads I, O1, O2, and 03 respectively connected to the common input terminal IN and the output terminals OUT1, OUT2, and OUT3, and three electrode pads C1, C2, and C3 respectively connected to the control terminals Ctl1, Ctl2, and Ctl3, are provided in a peripheral portion of the substrate 11.

Gate wirings 120 of a second metal layer indicated by dotted lines are constituted by a gate metal layer (e.g., Pt/Mo) 20 formed simultaneously with the formation of the gate electrodes 17 of the FETs. Pad wirings 130 of a third metal layer indicated by full lines are constituted by a pad meal layer (Ti/Pt/Au) 30 which connects components and forms the pads. An ohmic metal layer (AuGe/Ni/Au), which is a first metal layer and forms an ohmic contact to the substrate 11 in FIG. 14, the ohmic metal layer is not illustrated because it is overlapped by the pad metal layer 30.

The first, second, and third FET groups F1, F2, and F3 have similar configurations. Accordingly, the first FET group F1 will be mainly described below. In FET1-1, three comb-teeth-like portions of the pad metal layer 30 which are extended from the upper side constitute a second source electrode 15 (or a second drain electrode 16) connected to the common input terminal pad I. Under the second source electrode 15, there is a first source electrode formed by the ohmic metal layer. Further, three comb-teeth-like portions of the pad metal layer 30 which are extended from the lower side constitute a second drain electrode 16 (or a second source electrode 15) of FET1-1. Under the second drain electrode 16, there is a first drain electrode formed by the ohmic metal layer. The second source and drain electrodes 15 and 16 are placed in a shape in which the comb-teeth-like portions are engaged. A gate electrode 17 formed by the gate metal layer 20 is placed therebetween in a shape having five comb-teeth-like portions.

Operating regions 100 are formed in regions indicated by dashed-dotted lines by, for example, implanting ions into the GaAs substrate 11. Alternatively, the operating regions 100 are formed in the regions indicated by the dashed-dotted lines by stacking a plurality of semiconductor layers on the GaAs substrate and isolating the operating regions 100 with insulating regions 50.

In FET1-2, three second source electrodes 15 (or second drain electrodes 16) extended from the upper side are connected to the second drain electrodes 16 of FET1-1. Here, the second source electrodes 15 (or the second drain electrodes 16) are merely via points for a high-frequency signal, and generally do not need to be led to the outside. Accordingly, no pad is provided for these electrodes. Further, three second drain electrodes 16 extended from the lower side are connected to second source electrodes 15 of FET1-3. The second drain electrodes 16 are also merely via points for a high-frequency signal, and generally do not need to be led to the outside. Accordingly, no pad is provided for these electrodes. Under the second source and drain electrodes 15 and 16, there is the ohmic metal layer. The second source and drain electrodes 15 and 16 are placed in a shape in which the comb-teeth-like portions are engaged. A gate electrode 17 formed by the gate metal layer 20 is placed therebetween in a shape having five comb-teeth-like portions. Compared to a switch circuit device including one stage of an FET, the switch circuit device including a plurality of stages of FETs connected in series is a high-power switch circuit device because each FET group can withstand a larger voltage amplitude when the FET group is off. In this case, source and drain electrodes of the FETs which become junctions when the FETs are connected in series generally do not need to be led to the outside. Accordingly, there is no need to provide pads for such source and drain electrodes.

In FET1-3, three comb-teeth-like portions of the pad metal layer 30 which are extended from the upper side constitute a second source electrode 15 (or a second drain electrode 16). Under the second source electrode 15, there is a first source electrode formed by the ohmic metal layer. Further, three comb-teeth-like portions of the pad metal layer 30 which are extended from the lower side constitute a second drain electrode 16 (or a second source electrode) connected to the output terminal pad O1. Under the second drain electrode 16, there is a first drain electrode formed by the ohmic metal layer. The second source and drain electrodes 15 and 16 are placed in a shape in which the comb-teeth-like portions are engaged. A gate electrode 17 formed by the gate metal layer 20 is placed therebetween in a shape having five comb-teeth-like portions.

It should be noted that a cross-sectional view taken along line i-i in FIG. 14 is similar to FIG. 2B in the case of FETs in which the operating regions 100 are formed by ion implantation or similar to FIG. 6A in the case of HEMTs.

The comb-teeth-like portions of the gate electrodes 17 of the FETs of the first FET group F1 are respectively bundled by the gate wirings 120 formed by the gate metal layer 20 outside the operating regions 100, and are connected to the first control terminal pad C1 through the first control resistor CR1.

The first control resistor CR1 includes a low-resistance element LR1. High-resistance elements HR11 and HR12 are connected in series with portions of the low-resistance element LR1.

Further, the low-resistance element LR1 of the first control resistor CR1 is placed along and near the common input terminal pad I. Thus, a protecting element 200 is connected between the common input terminal pad I and the first control terminal pad C1. This protecting element 200 between the common input terminal pad I and the first control terminal pad C1 is referred to as a protecting element 200b. It should be noted that a cross-sectional view taken along line j-j of FIG. 14A is similar to FIG. 3C or 6B. Thus, electrostatic breakdown voltage can be greatly improved.

Here, as for the third FET group F3, a low-resistance element LR3 of the third control resistor CR3 cannot be placed near the common input terminal pad I. Accordingly, the pad wiring 130 connected to the common input terminal pad I is used. That is, a peripheral impurity region 150 is provided in the vicinity of the pad wiring 130, and the low-resistance element LR3 is placed near this peripheral impurity region 150.

Thus, as illustrated in FIG. 14B, the protecting element 200(200b) is formed by the low-resistance element LR3, the peripheral impurity region 150 of the pad wiring 130, and an insulating region 203 (the GaAs substrate 11 or the insulating region 50). It should be noted that FIG. 14B illustrates the case where ions of an n-type impurity are implanted into the GaAs substrate 11. In the case of HEMTs, the peripheral impurity region 150 and the low-resistance element LR3 are isolated by providing insulating regions 50 around the peripheral impurity region 150 and the low-resistance element LR3.

Further, the low-resistance element LR1 is placed near the first output terminal pad O1. Thus, another protecting element 200 is connected between the first control terminal Ctl1 and the first output terminal OUT1. The other protecting element 200 between the first output terminal pad O1 and the first control terminal pad C1 is referred to as a protecting element 200a. Thus, it is possible to improve the minimum value of the electrostatic breakdown voltage of the switch circuit device.

The high-resistance element HR11 is connected in series with the low-resistance element LR1 constituting the first control resistor CR1. Further, the high-resistance element HR11 is connected between the gate electrode 17 (the gate wiring 120) of FET1-3 and connection point CP of the protecting element 200a immediately near FET1-3.

The high-resistance element HR12 is connected in series with the low-resistance element LR1 constituting the first control resistor CR1. Further, the high-resistance element HR12 is connected between the gate electrode 17 (the gate wiring 120) of FET1-1 and connection point CP of the protecting element 200b immediately near FET1-1.

Similarly, high-resistance elements HR21 and HR22 are respectively connected as parts of the second control resistor CR2, and high-resistance elements HR31 and HR32 are connected as parts of the third control resistor CR3.

A cross-sectional view of the high-resistance element HR11 (or HR12) which is taken along line l-l of FIG. 14A is similar to FIG. 4 or 7A. That is, the high-resistance element HR11 for the case (FIG. 4) of FETs in which a channel layer 12 is formed by ion implantation, is formed to have a resistance value of not less than 5 kΩ by implanting ions of the same impurity as that forming the channel layer 12 into the GaAs substrate 11 so that a peak concentration comparable to that of the channel layer 12 is obtained.

On the other hand, the high-resistance element HR11 for the case (FIG. 7A) of HEMTs is isolated from the surrounding region by an insulating region 50 and formed to have a resistance value of not less than 5 kΩ by etching the cap layer 37. In the case of the HEMTs, a cross-sectional view taken along line m-m of FIG. 14A is similar to FIG. 7B. As illustrated in FIG. 7B, a semiconductor layer under a recess portion 101 is exposed in the recess portion 101. Since semiconductor layers under the cap layer 37 serve as resistive layers, a high resistance value can be obtained with a short distance.

If a resistor of not less than 5 kΩ includes only the low-resistance element LR1, the resistor cannot be contained in a space on the path of the first control resistor CR1. A resistor of not less than 5 kΩ can be placed without particularly increasing the chip size by constructing the resistor using the high-resistance elements HR11 and HR12 as in this embodiment.

The high-resistance element HR11 is connected between the gate electrode 17 of FET1-3 and the protecting element 200a of the first output terminal pad O1. This makes it possible to prevent a high-frequency signal from leaking between gate terminal G and drain terminal D of FET1-3 (See FIGS. 12A to 12C).

Further, the high-resistance element HR12 is connected between the gate electrode 17 of FET1-1 and the protecting element 200b of the common input terminal pad I. This makes it possible to prevent a high-frequency signal from leaking between the gate terminal G and the source terminal S of FET1-1(See FIGS. 12A to 12C).

Thus, the resistance value of the first control resistor CR1 between each of the protecting elements 200a and 200b and the corresponding gate electrode 17 becomes not less than 5 kΩ. That is, although there are parasitic capacitances due to the protecting elements 200 being connected, paths p1 and p2 for high-frequency signals can be prevented from occurring. Accordingly, electrostatic breakdown voltage can be improved without deteriorating isolation. It should be noted that since the switch MMIC of this sixth embodiment includes three stages of FETs, the distance between the protecting elements 200a and 200b is sufficiently large. Accordingly, as for the resistance therebetween, a resistance value of not less than 5 kΩ can be ensured with a structure including only the low-resistance element LR1. That is, even if the high-resistance element HR12 is not connected between the protecting elements 200a and 200b unlike the first embodiment, there is no deterioration in isolation between the first output terminal pad O1 and the common input terminal pad I due to the protecting elements 200a and 200b being connected.

It should be noted that although HR12 is connected between the protecting elements 200a and 200b in this embodiment, the purpose of this is to prevent a high-frequency signal from leaking between the gate terminal G and the source terminal S of FET1-1 as described previously, which is different from HR12 of the first embodiment.

Further, the substrate structure and the high-resistance elements HR11, HR12, HR21, HR22, HR31, and HR32 for the case of the HEMTs may be similar to those of the third or fourth embodiment.

In the case where each of a first switching element F1 and a second switching element F2 (and third switching element F3) includes a plurality of stages, the number of stages of FETs is not limited to those of the above-described examples.

It should be noted that a high-resistance element may not be an impurity-implanted region or a region in which a semiconductor layer under a cap layer is exposed by etching the cap layer. For example, a high-resistance element may be a metal resistor formed of evaporated NiCr and the like.

According to the embodiments of the present invention, the following effects can be obtained.

First, in a switch MMIC in which a protecting element is connected to at least one of a common input terminal pad and an output terminal pad, a high-resistance element (resistor constituted by an impurity region having a high sheet resistance) of not less than 5 kΩ is connected to a connecting path(control resistor) to which the protecting element is connected. The high-resistance element is connected between the protecting element and a switching element.

The high-resistance element is connected between the switching element and the protecting element immediately near the switching element. For example, on the control resistor extending from a control terminal pad, approaching the common input terminal pad, then approaching the output terminal pad, and reaching the switching element, the high-resistance element is connected between the protecting element on the output terminal pad side and the gate electrode. This makes it possible to prevent a path for a high-frequency signal from occurring between the drain terminal D and the gate terminal G of an FET constituting the switch MMIC. That is, since a high-frequency signal does not leak through this path, isolation is not deteriorated. Thus, the electrostatic breakdown voltage between an output terminal and a control terminal can be improved.

Further, connecting a high-resistance element between adjacent protecting elements makes it possible to prevent a path for a high-frequency signal from occurring between the drain terminal D and the source terminal S of the FET (between the output terminal pad and the common input terminal pad). That is, since a high-frequency signal does not leak through this path, isolation is not deteriorated. Thus, the electrostatic breakdown voltage between an input terminal and the control terminal can be improved.

Second, in the case of an FET in which an operating region is formed by ion implantation, the high-resistance element is an implanted region and, for example, an impurity region having a peak concentration comparable to that of a channel layer. Accordingly, the high-resistance element can be formed by the same process as that for the channel layer. A low-resistance element can be formed by the same process as that for a source or drain region of the operating region. Accordingly, the embodiments of the present invention can be carried out by merely changing a pattern for ion implantation in the operating region.

Third, in the case of a HEMT, the high-resistance element is a region where a semiconductor layer under a cap layer is exposed by providing a recess portion in which the cap layer is removed. By removing the cap layer having a high impurity concentration, the channel layer having a high sheet resistance becomes a major current path in a region which serves as the high-resistance element. Since the channel layer has a sheet resistance several times higher than that of the cap layer, the same resistance value can be obtained with a shorter distance than in the case where a resistive layer including the cap layer is provided. Accordingly, the distance over which a resistor is routed in a chip is reduced by a factor of several. Thus, in the case where a resistor having a high resistance is connected, an increase of the chip area can be suppressed. Further, since the recess portion can be formed simultaneously with an alignment mark formation step in which the cap layer is removed, the high-resistance element can be formed without newly adding a step in particular.

Fourth, by providing an InGaP layer on a barrier layer, the InGaP layer can be used as an etch stop layer. Thus, the stability of a process can be improved.

Fifth, by providing the InGaP layer on the barrier layer and exposing the InGaP layer of which surface is stable, at a bottom portion of the recess portion, the channel layer under the InGaP layer can be reliably protected, and reliability can be improved.

Sixth, by removing the cap layer so that the barrier layer is exposed at a bottom portion of the recess portion, a resistive layer can be reliably formed in which almost only the channel layer becomes a major current path.

Further, in the case where the InGaP layer used as an etch stop layer on the barrier layer is doped with an impurity, the sheet resistance of a resistive element can be further improved by removing even the InGaP layer so that the barrier layer is at a bottom portion of the recess portion.

What is claimed is:

1. A compound semiconductor switch circuit device comprising:
   two or more switching elements formed on a compound semiconductor substrate, each of the switching elements comprising at least one gate, a signal input portion and a signal output portion;
   a common input terminal pad formed on the substrate and connected with the signal input portions of the switching elements;
   an output terminal pad provided for each of the switching elements and connected with a corresponding signal output portion, the output terminal pads being formed on the substrate;
   a control terminal pad provided for each of the switching elements and connected with a corresponding gate, the control terminal pads being formed on the substrate;
   a single connecting path connecting one of the control terminal pads and a corresponding gate;
   a first protecting element connected between the common input terminal pad and the single connecting path and comprising a first conduction region, a second conduction region and a first insulating region disposed between the first and second conduction regions; and
   a second protecting element connected between one of the output terminal pads and the single connecting path and comprising a third conduction region, a fourth conduction region and a second insulating region disposed between the third and fourth conduction regions,
   wherein the single connecting path comprises a high-resistance element that has a resistance higher than an average resistance of the single connecting path and is disposed between the first and second protecting elements that are disposed along the single connecting path.

2. The compound semiconductor switch circuit device of claim 1, wherein the high-resistance element comprises a fifth conduction region.

3. The compound semiconductor switch circuit device of claim 2, wherein each of the switching elements comprises an HEMT comprising a stack of a buffer layer, an electron supply layer, a channel layer, a barrier layer and a cap layer, and the third conduction region comprises a portion of the stack that does not include the cap layer.

4. The compound semiconductor switch circuit device of claim 3, wherein a sheet resistance of the third conduction region is higher than a sheet resistance of the cap layer.

5. The compound semiconductor switch circuit device of claim 3, wherein the upper most layer of the third conduction region is the barrier layer.

6. The compound semiconductor switch circuit device of claim 3, wherein an InGaP layer is disposed on the barrier layer, and the InGaP layer is the upper most layer of the third conduction region.

7. The compound semiconductor switch circuit device of claim 2, wherein each of the switching elements comprises a field effect transistor comprising a channel layer comprising a first doped impurity region formed in the substrate, and the fifth conduction region comprises a second doped impurity region formed in the substrate that has an impurity concentration equal to an impurity concentration of the first doped impurity region.

8. The compound semiconductor switch circuit device of claim 1, wherein the high-resistance element has a resistance higher than 5 k$\Omega$.

9. The compound semiconductor switch circuit device of claim 1, wherein part of the connecting path is configured to operate as the first conduction region of the protecting element.

10. The compound semiconductor switch circuit device of claim 9, wherein a fifth conduction region is disposed adjacent an edge portion of the common input terminal pad, an edge portion of a pad wiring connected with the common input terminal pad, an edge portion of the output terminal pad or an edge portion of another pad wiring connected with the output terminal pad, and part of the fifth conduction region is configured to operate as the second conduction region of the protecting element.

11. The compound semiconductor switch circuit device of claim 1 wherein the common input terminal pad is configured to receive a high-frequency analog signal.

* * * * *